(12) United States Patent
Yamazaki et al.

(10) Patent No.: US 9,088,006 B2
(45) Date of Patent: Jul. 21, 2015

(54) LIGHT-EMITTING DEVICE AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Shingo Eguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 95 days.

(21) Appl. No.: 13/886,474

(22) Filed: May 3, 2013

(65) Prior Publication Data

US 2013/0299789 A1    Nov. 14, 2013

(30) Foreign Application Priority Data

| May 9, 2012 | (JP) | 2012-107283 |
| May 9, 2012 | (JP) | 2012-107284 |
| May 10, 2012 | (JP) | 2012-108190 |
| Mar. 7, 2013 | (JP) | 2013-044857 |

(51) Int. Cl.

| *H01L 29/22* | (2006.01) |
| *H01L 51/52* | (2006.01) |
| *H01L 27/32* | (2006.01) |
| *H01L 51/00* | (2006.01) |

(52) U.S. Cl.
CPC ........ *H01L 51/5246* (2013.01); *H01L 27/3244* (2013.01); *H01L 27/3276* (2013.01); *H01L 27/322* (2013.01); *H01L 51/0097* (2013.01); *H01L 2251/5338* (2013.01); *H01L 2251/558* (2013.01)

(58) Field of Classification Search
CPC . H01L 51/5246; H01L 51/56; H01L 27/3276; H01L 51/524; H01L 51/5253
USPC .............................. 257/99, E33.062, E33.066
See application file for complete search history.

(56) References Cited

U.S. PATENT DOCUMENTS

| 5,107,175 A | 4/1992 | Hirano et al. |
| 5,124,204 A | 6/1992 | Yamashita et al. |
| 5,189,405 A | 2/1993 | Yamashita et al. |
| 5,686,360 A | 11/1997 | Harvey, III et al. |
| 5,693,956 A | 12/1997 | Shi et al. |

(Continued)

FOREIGN PATENT DOCUMENTS

| JP | 10-125931 | 5/1998 |
| JP | 2003-174153 | 6/2003 |
| WO | WO 2006/046679 A1 | 5/2006 |

OTHER PUBLICATIONS

Kim, G.H. et al, "Thin Film Passivation for Longevity of Organic Light-Emitting Devices and Organic Thin-Film Transistor," IDW '03: Proceedings of the 10$^{th}$ International Display Workshops, Dec. 3, 2003, pp. 387-390.

(Continued)

*Primary Examiner* — Andy Huynh
(74) *Attorney, Agent, or Firm* — Husch Blackwell LLP

(57) ABSTRACT

A light-emitting device includes a light-emitting element between two substrates, a terminal portion which includes at least two terminals and is electrically connected to the light-emitting element, and an adhesive layer between the two substrates. A substrate having a coefficient of thermal expansion of 10 ppm/K or lower is used as a substrate that overlaps with a terminal portion connected to an FPC.

9 Claims, 20 Drawing Sheets

(56) References Cited

U.S. PATENT DOCUMENTS

| | | |
|---|---|---|
| 5,757,126 A | 5/1998 | Harvey, III et al. |
| 5,771,562 A | 6/1998 | Harvey, III et al. |
| 5,811,177 A | 9/1998 | Shi et al. |
| 5,952,778 A | 9/1999 | Haskal et al. |
| 6,127,199 A | 10/2000 | Inoue et al. |
| 6,146,225 A | 11/2000 | Sheats et al. |
| 6,150,187 A | 11/2000 | Zyung et al. |
| 6,198,217 B1 | 3/2001 | Suzuki et al. |
| 6,198,220 B1 | 3/2001 | Jones et al. |
| 6,294,478 B1 | 9/2001 | Sakaguchi et al. |
| 6,372,608 B1 | 4/2002 | Shimoda et al. |
| 6,413,645 B1 | 7/2002 | Graff et al. |
| 6,492,026 B1 | 12/2002 | Graff et al. |
| 6,506,664 B1 | 1/2003 | Beyne et al. |
| 6,521,511 B1 | 2/2003 | Inoue et al. |
| 6,522,067 B1 | 2/2003 | Graff et al. |
| 7,178,927 B2 | 2/2007 | Seo |
| 7,229,900 B2 | 6/2007 | Takayama et al. |
| 7,332,381 B2 | 2/2008 | Maruyama et al. |
| 8,030,132 B2 | 10/2011 | Ogita et al. |
| 8,188,474 B2 | 5/2012 | Hatano et al. |
| 8,367,440 B2 | 2/2013 | Takayama et al. |
| 2001/0020922 A1 | 9/2001 | Yamazaki et al. |
| 2002/0125817 A1 | 9/2002 | Yamazaki et al. |
| 2003/0032210 A1 | 2/2003 | Takayama et al. |
| 2006/0145603 A1 | 7/2006 | Taniguchi et al. |
| 2009/0023232 A1 | 1/2009 | Taniguchi et al. |
| 2011/0052836 A1 | 3/2011 | Kim et al. |
| 2011/0175101 A1* | 7/2011 | Hatano et al. ............ 257/72 |
| 2012/0061665 A1* | 3/2012 | Miyake et al. ............ 257/43 |
| 2012/0146035 A1* | 6/2012 | Kuwabara ................. 257/59 |

OTHER PUBLICATIONS

Chwang, A. et al, "64.2: Full Color 100 dpi AMOLED Displays on Flexible Stainless Steel Substrates," SID 06 Digest: SID International Symposium Digest of Technical Papers, vol. 37, book 2, Jun. 6, 2006, 1858-1861.

Jin, D.U. et al, "64.1: 5.6-Inch Flexible Full Color Top Emission AMOLED Display on Stainless Steel Foil," SID 06 Digest: SID International Symposium Digest of Technical Papers, vol. 37, book 2, Jun. 6, 2006, pp. 1855-1857.

* cited by examiner

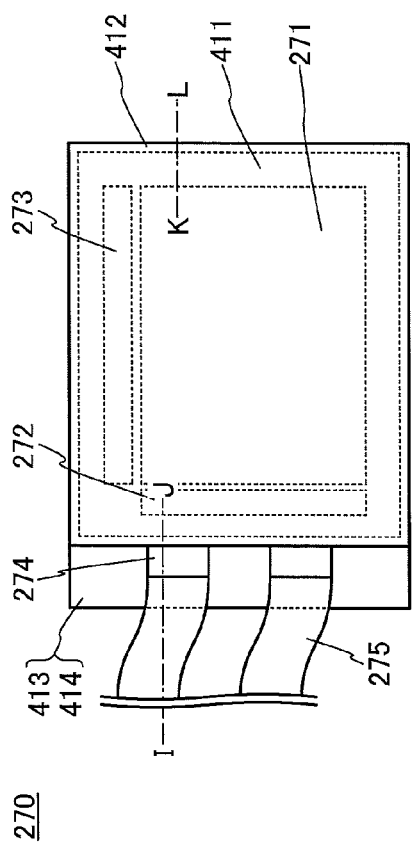
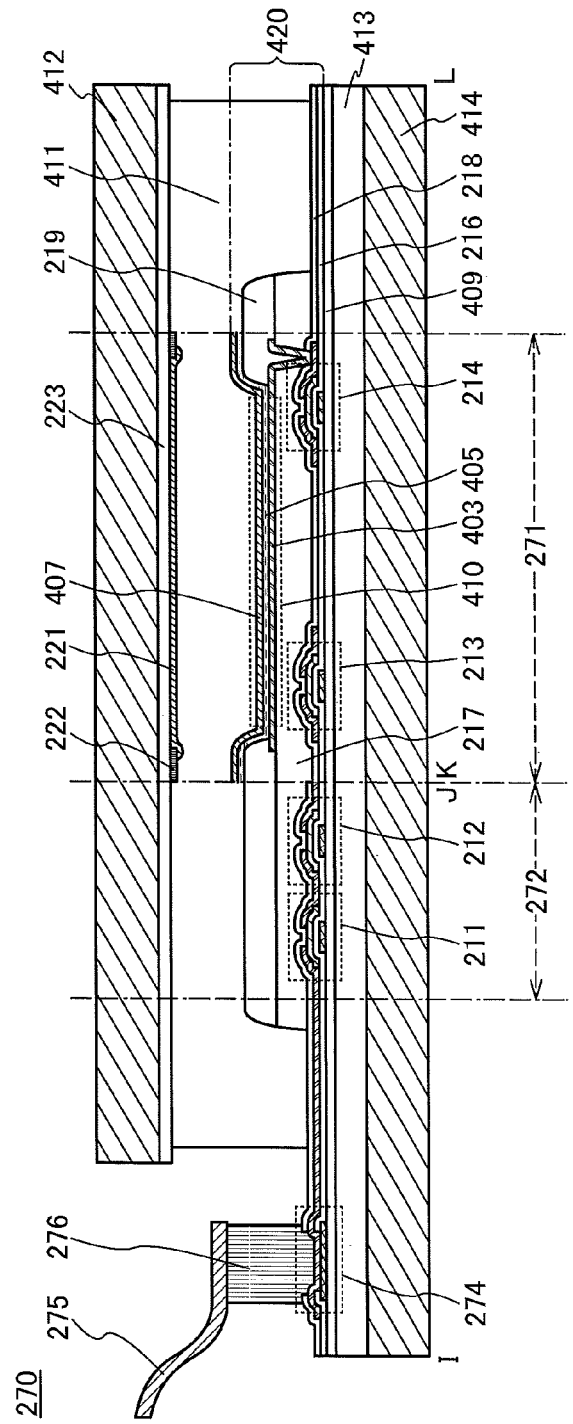
FIG. 10A
FIG. 10B

LIGHT-EMITTING DEVICE AND ELECTRONIC DEVICE

BACKGROUND OF THE INVENTION

1. Field of the Invention

The present invention relates to a light-emitting device, an electronic device, and a lighting device each using organic electroluminescence (hereinafter also referred to as EL).

2. Description of the Related Art

In recent years, research and development have been actively conducted on light-emitting elements utilizing organic EL (organic EL elements). In the fundamental structure of the organic EL element, a layer containing a light-emitting organic compound (EL layer) is sandwiched between a pair of electrodes.

Since the organic EL element is a self-luminous type, a light-emitting device including the organic EL element has advantages of high visibility, no necessity of a backlight, low power consumption, and the like. In addition, the light-emitting device including the organic EL element also has advantages that it can be thin and lightweight and it is highly responsive to input signals.

Furthermore, the light-emitting device including an organic EL element can achieve reduction in thickness and weight, and further have flexibility and high impact resistance; therefore, use of such a light-emitting element for a substrate having flexibility (a flexible substrate) has been proposed. The light-emitting element is applied not only to a light-emitting device but also to a semiconductor device or the like which operates by utilizing semiconductor characteristics.

For example, Patent Document 1 discloses a flexible active matrix light-emitting device in which an organic EL element or a transistor serving as a switching element is provided over a film substrate.

In addition, Patent Document 2 discloses an organic EL display device including, over a resin substrate formed of a flexible film, an organic EL display panel including an organic EL element, an inorganic barrier film covering a surface of the resin substrate, and a resin sealing film surrounding the organic EL display panel.

As a method for manufacturing a semiconductor device using a flexible substrate, a technique in which a semiconductor element such as a thin film transistor is formed over a base material such as a glass substrate or a quartz substrate, and then the semiconductor element is transferred from the base material to another base material (for example, a flexible base material) has been developed. In order to transfer the semiconductor element to another base material, a step for separating the semiconductor element from the base material that is used for forming the semiconductor element is necessary.

For example, in Patent Document 3, the following peeling technique using laser ablation is described. First, a separation layer formed of amorphous silicon is provided over a substrate, a layer to be peeled which includes a thin film element is formed over the separation layer, and the layer to be peeled is bonded to an object to which the layer to be peeled is transferred, by an adhesive layer. The separation layer is ablated by laser irradiation, so that separation is generated in the separation layer.

Furthermore, in Patent Document 1, a technique is described in which peeling is performed by physical force such as human hands. In Patent Document 1, a metal layer is fanned between a substrate and an oxide layer and separation is generated at an interface between the oxide layer and the metal layer by utilizing weak bonding between the oxide layer and the metal layer at the interface, so that the layer to be separated and the substrate are separated from each other.

REFERENCE

Patent Document

[Patent Document 1] Japanese Published Patent Application No. 2003-174153
[Patent Document 2] International Publication WO 2006/046679
[Patent Document 3] Japanese Published Patent Application No. H10-125931

SUMMARY OF THE INVENTION

In a light-emitting device including a flexible substrate, however, stress is applied to a transistor and an organic EL element when physical force, such as bending or curving, is externally applied, and thus these elements are damaged in some cases.

Damage of any one of a transistor and an organic EL element causes a display defect of a light-emitting device.

In view of the above, an object of one embodiment of the present invention is to provide a highly reliable light-emitting device in which damage caused to a transistor and an organic EL element when physical force is externally applied is avoided.

With the structure described in Patent Document 2, there is a possibility that an organic EL element is damaged when mechanical pressure is locally applied from the surface of the resin sealing film.

Moreover, a resin sealing film is formed thick in order to increase mechanical strength according to Patent Document 2, the following problems occur. First, when a resin sealing film is formed thick in order to increase mechanical strength sufficiently, a device itself is thick and loses its flexibility. Second, when the resin sealing film is made thick, the device itself rolls up due to stress caused by contraction of the resin sealing film.

In view of the above, an object of one embodiment of the present invention is to provide a light-emitting device having both high flexibility and high mechanical strength.

Moreover, as to mounting of the light-emitting device formed over the flexible substrate, a connector (flexible printed circuit: FPC) or the like is bonded to a terminal electrode through an anisotropic conductive film by thermocompression bonding, so that electrical connection is made. In this thermocompression bonding step, the flexible substrate itself or a resin and a wiring provided over the substrate may be thermally damaged, which causes display defects of the light-emitting device in some cases. This is because the flexible substrate has flexibility and thus is deformed due to heat, so that a crack is generated in the resin and the wiring.

Accordingly, an object of one embodiment of the present invention is to provide a light-emitting device, in which FPC is pressure-bonded so that electrical conduction with a terminal electrode is made without a crack in a wiring.

A light-emitting device of one embodiment of the present invention includes, between a pair of flexible substrates, a planarization layer, a transistor over one surface of the planarization layer, an organic EL element in contact with the other surface of the planarization layer, and an adhesive layer for bonding the flexible substrates. In the light-emitting device of one embodiment of the present invention, each layer is provided so that a difference between the thickness that is a distance from one surface of the light-emitting device to the other surface of the planarization layer (i.e., a thickness on the side including a transistor) and the thickness that is a distance from the other surface of the planarization layer to the other surface of the light-emitting device is small; thus, a difference between stress applied to the transistor and stress applied to the organic EL element when physical power is externally applied is small. Note that in this specification, a structure in which A and B are bonded with C includes not only a structure in which A and B are each in contact with C but also a structure D positioned over A and E positioned over B are each in contact with C, so that A and B are bonded.

In the light-emitting device, a neutral plane (a plane which does not expand or contract) in which distortion of stress, such as compressive stress or tensile stress, due to deformation such as bending is not caused is positioned near both the transistor and the organic EL element; for example, the neutral plane is positioned in the planarization layer, the transistor, or the organic EL element. Thus, values of stresses applied to the transistor and the organic EL element can be small. Therefore, damage to the transistor and/or the organic EL element due to bending or curving can be suppressed, thereby achieving a highly reliable light-emitting device.

In this specification and the like, one surface and the other surface of a substrate or a planarization layer refer to surfaces which face to each other.

Specifically, a light-emitting device of one embodiment of the present invention includes a planarization layer between one surface of a first flexible substrate and one surface of a second flexible substrate; a transistor over one surface of the planarization layer; a light-emitting element including a first electrode which is in contact with the other surface of the planarization layer and electrically connected to the transistor, a layer containing a light-emitting organic compound over the first electrode, and a second electrode over the layer containing a light-emitting organic compound; and an adhesive layer for bonding the first flexible substrate and the second flexible substrate. In the light-emitting device, thickness A that is a distance from the other surface of the first flexible substrate to the other surface of the planarization layer is 0.8 to 1.2 times as large as thickness B that is a distance from the other surface of the planarization layer to the other surface of the second flexible substrate. That is, thickness A that is a distance from the other surface of the first flexible substrate to an interface between the planarization layer and the adhesive layer is 0.8 to 1.2 times as large as thickness B that is a distance from the interface between the planarization layer and the adhesive layer to the other surface of the second flexible substrate.

In the above light-emitting device, it is more preferable that thickness A be 0.9 to 1.1 times as large as thickness B.

A light-emitting device of one embodiment of the present invention includes a planarization layer between one surface of a first flexible substrate and one surface of a second flexible substrate; a transistor over one surface of the planarization layer; a light-emitting element including a first electrode which is in contact with the other surface of the planarization layer and electrically connected to the transistor, a layer containing a light-emitting organic compound over the first electrode, and a second electrode over the layer containing a light-emitting organic compound; and an adhesive layer for bonding the first flexible substrate and the second flexible substrate. In the light-emitting device, thickness B that is a distance from the other surface of the planarization layer to the other surface of the second flexible substrate is 0.8 to 1.2 times as large as thickness A that is a distance from the other surface of the first flexible substrate to the other surface of the planarization layer.

In the above light-emitting device, it is more preferable that thickness B be 0.9 to 1.1 times as large as thickness A.

An element with low resistance to stress is particularly preferably provided near the neutral plane. In this manner, stress applied to the element when physical power is externally applied can be reduced. Thus, in the above light-emitting device, the planarization layer is preferably in contact with the transistor.

The light-emitting device of one embodiment of the present invention has flexibility, is provided over an insulating surface, and includes a light-emitting element. The light-emitting device includes, a layer containing a light-emitting organic compound is interposed between a pair of electrodes, a first protection layer covers the light-emitting element, and a second protection layer is provided over the first protection layer. In addition, it is preferable that the thickness of the first protection layer be greater than or equal to 0.1 µm and less than 100 µm, and at least a surface of the second protection layer, which does not face the light-emitting element, have a higher hardness than a surface of the first protection layer.

Here, since the surface of the first protection layer is softer than the surface of the second protection layer, in the case where mechanical pressure is locally applied from the second protection layer side or the light-emitting device is bent, stress applied to the light-emitting element can be reduced (such an effect is also referred to as cushion effect). Note that when the thickness of the first protection layer is less than 0.1 µm, there is a possibility that the light-emitting element is damaged because the stress cannot be sufficiently reduced. On the other hand, when the thickness of the first protection layer is greater than or equal to 100 µm, there is a possibility that the light-emitting device loses its flexibility or the light-emitting device winds up.

In addition, the thickness of the first protection layer in a region overlapping with an element layer (including the light-emitting element and the like) may differ from the thickness of the first protection layer in a region where the element layer is not provided. Similarly, in the case where the top surface of the element layer is not flat, the thickness of the first protection layer is not constant. Therefore, the smallest thickness of the first protection layer is within the above thickness range.

Thus, the first protection layer is formed to be sufficiently thin, stress applied to the light-emitting element can be reduced and the light-emitting device can have high flexibility. With the second protection layer which is provided on the outermost surface of the light-emitting device and has a high hardness at least at the surface, damage to an element by mechanical pressure externally applied can be suppressed even in the case where the first protection layer is formed to be thin, whereby the light-emitting device can have high flexibility and high mechanical strength.

A flexible light-emitting device of one embodiment of the present invention includes an element layer comprising a light-emitting element, the light-emitting element comprising a layer containing a light-emitting organic compound between a pair of electrodes; a first protection layer and a third protection layer with the light-emitting element is therebetween; a second protection layer over a surface of the first protection layer, which does not face the light-emitting element; and a fourth protection layer over a surface of the third protection layer, which does not face the light-emitting element. In the light-emitting device, the thickness of each of the first protection layer and the third protection layer is greater than or equal to 0.1 µm and less than 100 µm, the second protection layer has a higher hardness at least at a surface that does not face the light-emitting element than a surface of the first protection layer, and the fourth protection layer has a higher hardness at least at a surface that does not face the light-emitting element than a surface of the third protection layer.

With the above structure, the light-emitting element (an element layer including the light-emitting element) can be protected from both sides, thereby achieving a light-emitting device whose mechanical strength is further improved.

At this time, it is preferable that the first protection layer and the third protection layer be formed with the same material and the second protection layer and the fourth protection layer be formed with the same material, in which case common materials can be used.

In any of the above light-emitting devices, it is preferable that the first protection layer and the second protection layer have a property of transmitting visible light, and light from the light-emitting element be emitted through the first protection layer and the second protection layer.

Particularly in a light-emitting device with a structure in which light is emitted to the side on which a light-emitting element is formed (i.e., a top emission structure), the light-emitting element is easily damaged when the mechanical strength of the light-emitting surface is low. Accordingly, with the above structure of the light-emitting device, a highly reliable light-emitting device with a top emission structure, which has high flexibility and high mechanical strength, can be achieved The light-emitting device with any of the above structures preferably includes a color filter overlapping with the light-emitting element between the light-emitting element and the second protection layer. In the light-emitting device, the first protection layer and the second protection layer preferably have a property of transmitting visible light, the light-emitting element preferably emits white light, and light from the light-emitting element is preferably emitted through the first protection layer, the color filter, and the second protection layer.

With such a structure, the second protection layer functions not only as a protection layer of the light-emitting element but also as a protection layer of the color filter, which can prevent the occurrence of light leakage due to breakage of the color filter.

The light-emitting device with any of the above structures preferably includes a fifth protection layer containing a material that exhibits photocatalytic activity, which is in contact with the surface of the second protection layer.

The contamination with an organic substance on the surface of the light-emitting device can be suppressed by strong oxidation effect of the material that exhibits photocatalytic activity. Such a material shows a super hydrophilic effect; thus, oil contamination can be prevented from remaining; and contamination can be easily removed by exposing the surface to running water. As a result, the number of times mechanical pressure is applied to the light-emitting device, for example, by wiping off an organic substance attached or fixed on the surface of the light-emitting device, can be reduced. Thus, a defect such as a crack formed on the surface of the light-emitting device or damage to the light-emitting element can be suppressed.

One embodiment of the present invention is a light-emitting device including a first substrate, a second substrate facing the first substrate, a third substrate partly overlapping with the first substrate, a terminal portion over the third substrate, the terminal portion comprising at least two terminals, a light-emitting element electrically connected to the terminal in the terminal portion, and an adhesive layer for bonding the first substrate and the second substrate to seal the light-emitting element between the first substrate and the second substrate. In the light-emitting device, the coefficient of thermal expansion of the third substrate is 10 ppm/K or lower.

By heat applied to an anisotropic conductive film when an FPC is pressure-bonded to the terminal portion, a crack is likely to be generated in a substrate itself including the terminal portion or a resin and a wiring which are in contact with the substrate. In the light-emitting device of one embodiment of the present invention, the coefficient of thermal expansion of the third substrate is as small as 10 ppm/K or lower, and thus the third substrate is less likely to be deformed by heat, so that a crack is less likely to be generated in the third substrate itself or the resin and the wiring which are in contact with the third substrate.

Furthermore, since a substrate that does not transmit visible light can be used as the third substrate, a structure in which the third substrate does not overlap with the light-emitting element is preferred. With this structure, at least one of the first substrate and the second substrate is a substrate having a property of transmitting visible light; thus, a panel with any of a bottom emission structure, a top emission structure, and a dual emission structure can be obtained easily.

It is preferable that the first substrate and the third substrate be bonded to overlap with the terminal portion, and an absolute value ($|C-D|$) of a difference between a coefficient of thermal expansion C of a stacked substrate formed by bonding the first substrate and the third substrate and a coefficient of thermal expansion D of the second substrate be within 10% of the coefficient of thermal expansion C or within 10% of the coefficient of thermal expansion D.

When a difference in coefficient of thermal expansion between the second substrate and a stacked substrate of the first substrate and the third substrate is within 10% of the coefficient of thermal expansion of the stacked substrate or the second substrate, a warp of the substrate in one direction hardly occurs.

Another embodiment of the present invention is a light-emitting device including a first substrate, a second substrate facing the first substrate, a terminal portion comprising at least two terminals, a light-emitting element electrically connected to the terminal in the terminal portion, and an adhesive layer for bonding the first substrate and the second substrate to seal the light-emitting element between the first substrate and the second substrate. In the light-emitting device, the terminal portion is provided in a region where the first substrate does not overlap with the second substrate, and the coefficient of thermal expansion of the first substrate is 10 ppm/K or lower.

In the light-emitting device of one embodiment of the present invention, the coefficient of thermal expansion of the first substrate is as small as 10 ppm/K or lower, and thus the first substrate is less likely to be deformed by heat, so that a crack is less likely to be generated in the first substrate itself or the resin and the wiring which are in contact with the first substrate.

It is preferable that an absolute value ($|E-D|$) of a difference between a coefficient of thermal expansion E of the first substrate and a coefficient of thermal expansion D of the second substrate be within 10% of the coefficient of thermal expansion D or within 10% of the coefficient of thermal expansion E. When a difference in coefficient of thermal expansion between the first substrate and the second substrate is within 10% of at least one of the thermal expansion coefficients of the first substrate and the second substrate, a warp of the substrate in one direction hardly occurs.

Furthermore, a light-emitting device in which an FPC is attached to the terminal portion by thermocompression bonding is preferable.

Another embodiment of the present invention is an electronic device including the light-emitting device in a display portion. By the application of the above light-emitting device, a highly reliable electronic device can be achieved.

Note that a light-emitting device in this specification refers to an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

In a light-emitting device of one embodiment of the present invention, a difference between stress applied to a transistor and stress applied to an organic EL element when physical power is externally applied is small, and the values of the stresses are also small. Therefore, damage to the transistor or the organic EL element due to bending or curving can be suppressed, thereby achieving a highly reliable light-emitting device.

One embodiment of the present invention can provide a light-emitting device having both high flexibility and high mechanical strength.

One embodiment of the present invention can provide a light-emitting device in which generation of a crack is suppressed in a flexible substrate itself or a resin and a wiring which are in contact with the flexible substrate in the vicinity of an FPC terminal electrode.

BRIEF DESCRIPTION OF THE DRAWINGS

FIGS. 10A and 10B illustrate a display device of one embodiment of the present invention.

DETAILED DESCRIPTION OF THE INVENTION

Figure 1:
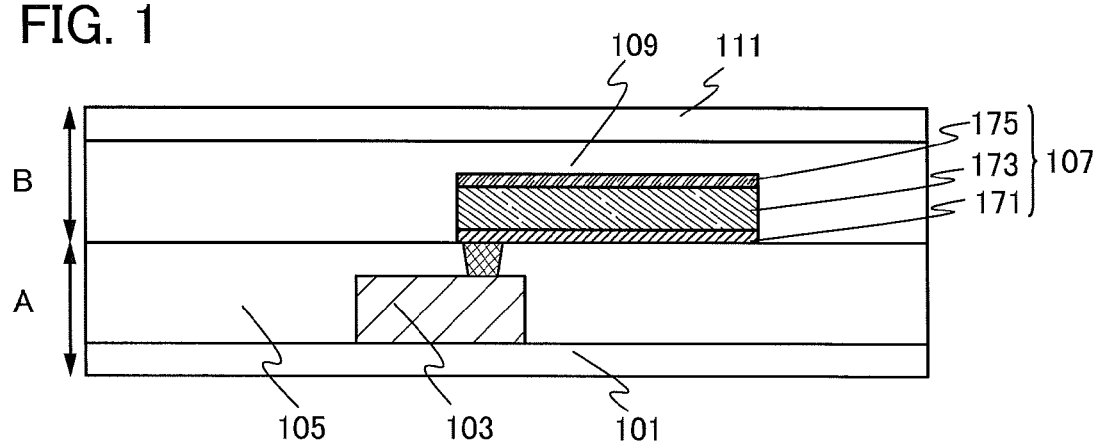
FIG. 1 illustrates a light-emitting device of one embodiment of the present invention.

Embodiments will be described in detail with reference to the drawings. Note that the present invention is not limited to the following description, and it will be easily understood by those skilled in the art that modes and details can be modified in various ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

In this embodiment, light-emitting devices of embodiments of the present invention will be described with reference to FIG. 1 and FIGS. 2A and 2B.

FIG. 1 is a schematic view of a light-emitting device of one embodiment of the present invention. The light-emitting device illustrated in FIG. 1 includes, between one surface of a first flexible substrate 101 and one surface of a second flexible substrate 111, a planarization layer 105, a transistor 103 provided on the one surface side of the planarization layer 105, an organic EL element 107 provided on the other surface side of the planarization layer 105, and an adhesive layer 109 for bonding the first flexible substrate 101 and the second flexible substrate 111 with the transistor 103, the planarization layer 105, and the organic EL element 107 are provided therebetween. The organic EL element 107 is provided on and in contact with the other surface of the planarization layer 105, and includes a first electrode 171 electrically connected to the transistor 103, a layer containing a light-emitting organic compound (EL layer) 173 over the first electrode 171, and a second electrode 175 over the EL layer 173.

In the light-emitting device illustrated in FIG. 1, the distance from the other surface of the first flexible substrate 101 to the other surface of the planarization layer 105 is denoted by thickness A. In the light-emitting device illustrated in FIG. 1, the distance from the other surface of the planarization layer 105 to the other surface of the second flexible substrate 111 is denoted by thickness B. That is, thickness A represents a distance from the other surface of the first flexible substrate 101 to an interface between the planarization layer 105 and the adhesive layer 109 and thickness B represents a distance form the interface between the planarization layer 105 and the adhesive layer 109 to the other surface of the second flexible substrate 111.

In the light-emitting device of one embodiment of the present invention, thickness A is 0.8 to 1.2 times (preferably 0.9 to 1.1 times) as large as thickness B, or thickness B is 0.8 to 1.2 times (preferably 0.9 to 1.1 times) as large as thickness A.

In the light-emitting device of one embodiment of the present invention, each layer is provided such that a difference between thickness A (the thickness on the side including the transistor 103) and thickness B (the thickness on the side including the organic EL element 107) is small; therefore, when physical power is externally applied, a difference between stress applied to the transistor 103 and stress applied to the organic EL element 107 is small.

In the light-emitting device, a neutral plane (a plane which does not expand or contract) in which distortion of stress, such as compressive stress or tensile stress, due to deformation such as bending is not caused is positioned near both the transistor 103 and the organic EL element 107; for example, the neutral plane is positioned in the planarization layer 105, the transistor 103, or the organic EL element 107. Thus, values of stresses applied to the transistor 103 and the organic EL element 107 can be small. Therefore, damage to the transistor 103 and/or the organic EL element 107 due to bending or curving can be suppressed, thereby achieving a highly reliable light-emitting device.

As the position of the element is further from the neutral plane, a compressive stress or tensile stress applied to the element becomes larger. An element with low resistance to stress is particularly preferably provided near the neutral plane. In this manner, stress applied to the element when physical power is externally applied can be reduced. Thus, in the light-emitting device of one embodiment of the present invention, the planarization layer 105 is preferably in contact with the transistor 103.

Examples of materials that can be used for the light-emitting device of one embodiment of the present invention are described. Materials for components of a light-emitting device in any of the following embodiments can be applied to the components of the light-emitting device of this embodiment.

[Flexible Substrate]

A flexible material is used for the first flexible substrate 101 and the second flexible substrate 111. In particular, for the substrate through which light emitted from the organic EL element 107 is extracted, a material that has a property of transmitting visible light (hereinafter referred to as light-transmitting property) in addition to flexibility is used.

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose coefficient of thermal expansion is low is preferred, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

In the case where a fibrous body is contained in the material having flexibility and a light-transmitting property, a high-strength fiber of an organic compound or an inorganic compound is used as the fibrous body. A high-strength fiber is specifically a fiber with a high tensile modulus of elasticity or a fiber with a high Young's modulus. Typical examples of a high-strength fiber include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As a glass fiber, there is a glass fiber using E glass, S glass, D glass, Q glass, or the like. These fibers may be used in a state of a woven fabric or a nonwoven fabric, and a structure in which this fibrous body is impregnated with a resin and the resin is cured may be used as the flexible substrate. When the structure including the fibrous body and the resin is used as the flexible substrate, reliability against bending or breaking due to local pressure can be increased, which is preferable.

To improve the light extraction efficiency, the refractive index of the material having flexibility and a light-transmitting property is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferred, because such a filler can maintain optical transparency.

Furthermore, since the substrate through which light emission is not extracted does not need to have a light-transmitting property, a metal substrate or the like can be used in addition to the above-mentioned substrates. To obtain flexibility and bendability, the thickness of a metal substrate is preferably greater than or equal to 10 μm and less than or equal to 200 μm, more preferably greater than or equal to 20 μm and less than or equal to 50 μm. Since a metal substrate has a high thermal conductivity, heat generated due to light emission of the organic EL element can be efficiently released.

There is no particular limitation on a material of the metal substrate, but it is preferable to use, for example, aluminum, copper, nickel, a metal alloy such as an aluminum alloy or stainless steel.

The flexible substrate may have a stacked structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials. Furthermore, to suppress a decrease in the lifetime of the organic EL element due to moisture and the like, a protection film with low water permeability may be provided. For example, a film including nitrogen and silicon (e.g., a film including silicon nitride or oxynitride silicon), or a film including nitrogen and aluminum (e.g., a film including aluminum nitride) may be provided.

[Transistor]

The structure of the transistor used for the light-emitting device of one embodiment of the present invention is not particularly limited. For example, a forward staggered transistor or an inverted staggered transistor may be used. Furthermore, the transistor may have a top-gate structure or a bottom-gate structure. In addition, there is no particular limitation on a material used for the transistor. For example, a transistor in which silicon, germanium, or an oxide semiconductor is used in a channel formation region can be employed.

[Planarization Layer]

The planarization layer 105 is an insulating film that is provided for reducing surface roughness caused by the transistor 103. For example, an organic material such as polyimide, acrylic, polyamide, polyimide amide, or a benzocyclobutene-based resin can be used. Alternatively, a low-dielectric constant material (a low-k material) or the like can be used. Furthermore, the planarization layer 105 may be formed by stacking two or more insulating films

[Organic EL Element]

The structure of the organic EL element used for the light-emitting device of one embodiment of the present invention is not particularly limited. The organic EL element may have a top emission structure, a bottom emission structure, or a dual emission structure. Examples of a structure of the organic EL element will be described in detail in Embodiment 7.

[Adhesive Layer]

In the case of using an organic EL element with a top emission structure, the adhesive layer 109 is formed with a material that transmits light from the organic EL element. For example, any of a variety of types of curable adhesive, e.g., a light curable adhesive such as a UV curable adhesive, a reactive curable adhesive, a thermal curable adhesive, and an anaerobic adhesive can be used. Examples of materials of such adhesives include an epoxy resin, an acrylic resin, a silicone resin, a phenol resin, and an imide resin. In particular, a material with low moisture permeability, such as an epoxy resin, is preferred. For example, the above adhesive may include a drying agent (such as zeolite). Accordingly, deterioration of the organic EL element can be suppressed. The refractive index of the adhesive layer is preferably high. For example, by mixing a filler with a high refractive index (e.g., titanium oxide or zirconium) into the adhesive layer, the efficiency of light extraction from the organic EL element can be improved.

Also in the case of using an organic EL element with a bottom emission structure, a material similar to the material used in the case of an organic EL element with a top emission structure can be used for the adhesive layer 109. Note that the adhesive layer 109 does not necessarily have a light-transmitting property.

<Structural Example 1 of Light-emitting Device>

Figure 2A:
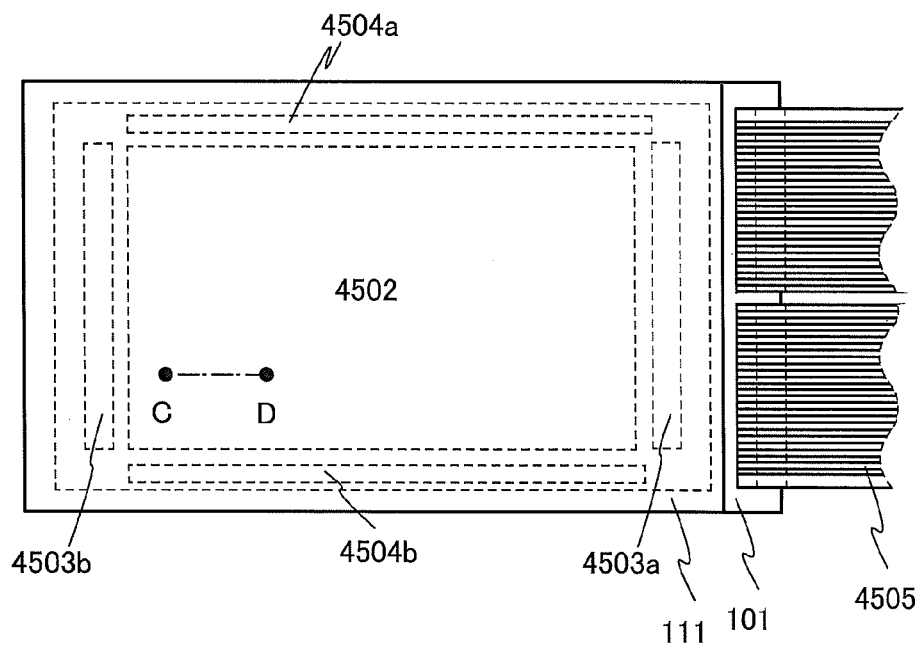
FIGS. 2A and 2B illustrate a light-emitting device of one embodiment of the present invention.
Figure 2B:
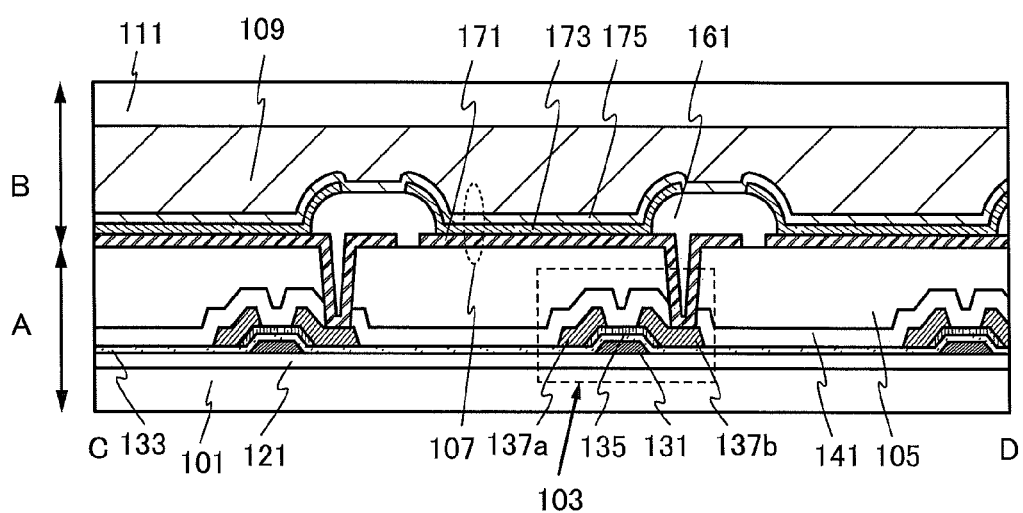

FIGS. 2A and 2B illustrate an example of a specific structure of a light-emitting device to which one embodiment of the present invention is applied. FIG. 2A is a plan view of a light-emitting device of one embodiment of the present invention. The light-emitting device illustrated in FIG. 2A includes a pixel portion 4502, a signal line driver circuit 4503a, a signal line driver circuit 4503b, a scan line driver circuit 4504a, a scan line driver circuit 4504b, and an FPC 4505. FIG. 2B is a cross-sectional view taken along an alternate long and short dash line C-D in FIG. 2A.

The light-emitting device illustrated in FIG. 2B includes, between one surface of the first flexible substrate 101 and one surface of the second flexible substrate 111, the planarization layer 105, the transistor 103 provided on the one surface side of the planarization layer 105, the organic EL element 107 provided on the other surface side of the planarization layer 105, and the adhesive layer 109 for bonding the first flexible substrate 101 and the second flexible substrate 111.

A base film 121 is provided over one surface of the first flexible substrate 101, and the transistor 103 is provided over the base film 121. The transistor 103 includes a gate electrode 131, a gate insulating film 133, a semiconductor layer 135, and a conductive layer 137a and a conductive layer 137b each functions as a source electrode or a drain electrode.

An insulating film 141 and the planarization layer 105 which cover the transistor are provided over the transistor 103.

The organic EL element 107 includes the first electrode 171 electrically connected to the conductive layer 137b, the EL layer 173, and the second electrode 175. An end portion of the first electrode 171 is covered with a partition wall 161.

In FIG. 2B, the distance from the other surface of the first flexible substrate 101 to the other surface of the planarization layer 105 is denoted by thickness A. In FIG. 2B, the distance from the other surface of the planarization layer 105 to the other surface of the second flexible substrate 111 is denoted by thickness B.

In the light-emitting device of one embodiment of the present invention, thickness A is 0.8 to 1.2 times (preferably 0.9 to 1.1 times) as large as thickness B, or thickness B is 0.8 to 1.2 times (preferably 0.9 to 1.1 times) as large as thickness A. Therefore, when physical power is externally applied, a difference between pressure applied to the transistor 103 and pressure applied to the organic EL element 107 is small.

In the light-emitting device, a neutral plane (a plane which does not expand or contract) in which distortion of stress, such as compressive stress or tensile stress, due to deformation such as bending is not caused is positioned near both the transistor 103 and the organic EL element 107; for example, the neutral plane is positioned in the planarization layer 105, the transistor 103, or the organic EL element 107. Thus, values of stresses applied to the transistor 103 and the organic EL element 107 can be small. Therefore, damage to the transistor 103 and/or the organic EL element 107 due to bending or curving can be suppressed, thereby achieving a highly reliable light-emitting device.

Examples of materials that can be used for the light-emitting device illustrated in FIGS. 2A and 2B are described. Note that the materials of components described above, such as the flexible substrate, are not repeatedly described.

[Base Film]

For stable characteristics of the transistor 103, or the like, the base film 121 is preferably provided. The base film 121 can be formed with an inorganic insulating film of silicon oxide, silicon nitride, silicon oxynitride, silicon nitride oxide, or the like to have a single-layer structure or a layered structure. The base film 121 can be formed by a sputtering method, a plasma CVD method, a coating method, a printing method, or the like. For example, a silicon oxide film may be formed by a sputtering method to a thickness greater than or equal to 10 nm and less than or equal to 3000 nm, preferably greater than or equal to 200 nm and less than or equal to 1500 nm. Note that the base film 121 is not necessarily provided unless needed.

[Transistor]

<Gate Electrode>

The gate electrode 131 can be formed to have a single-layer structure or a stacked-layer structure using any of metal materials such as molybdenum, titanium, chromium, tantalum, tungsten, aluminum, copper, neodymium, and scandium, or an alloy material which contains any of these elements, for example.

<Gate Insulating Film>

The gate insulating film 133 can be formed to have a single-layer structure or a stacked-layer structure using any of silicon oxide, silicon nitride, silicon oxynitride, silicon nitride oxide, and aluminum oxide by a plasma CVD method, a sputtering method, or the like. For example, a silicon oxynitride film may be formed using a deposition gas containing $SiH_4$ and $N_2O$ by a plasma CVD method.

<Semiconductor Layer>

The semiconductor layer 135 can be formed using a silicon semiconductor or an oxide semiconductor. There is no particular limitation on the crystallinity of a semiconductor, and any of an amorphous semiconductor or a semiconductor having crystallinity (a microcrystalline semiconductor, a polycrystalline semiconductor, and a semiconductor partly including crystal regions) may be used. A semiconductor having crystallinity is preferably used, in which case deterioration of transistor characteristics can be suppressed. As a silicon semiconductor, amorphous silicon, single crystal silicon, polycrystalline silicon, or the like can be used. As an oxide semiconductor, an In—Ga—Zn—O-based metal oxide or the like can be used. An oxide semiconductor that can be applied to one embodiment of the present invention will be described in Embodiment 8.

<Source Electrode and Drain Electrode>

As the conductive layer 137a and a conductive layer 137b each functioning as a source electrode or a drain electrode, for example, a metal film containing an element selected from aluminum, chromium, copper, tantalum, titanium, molybdenum, and tungsten, or a metal nitride film containing any of the above elements (e.g., a titanium nitride film, a molybdenum nitride film, or a tungsten nitride film) can be used. A structure may also be used in which a film of a high-melting-point metal such as titanium, molybdenum, or tungsten, or a nitride film of any of these metals (a titanium nitride film, a molybdenum nitride film, or a tungsten nitride film) is stacked either or both of over and under a metal film of aluminum, copper, or the like.

Alternatively, the conductive layers 137a and 137b may be formed with a conductive metal oxide. As the conductive metal oxide, indium oxide (e.g., $In_2O_3$), tin oxide (e.g., $SnO_2$), zinc oxide (ZnO), indium tin oxide (ITO), indium zinc oxide (e.g., $In_2O_3$—ZnO), or any of these metal oxide materials in which silicon oxide is contained can be used.

[Insulating Film]

The insulating film 141 has an effect of suppressing diffusion of impurities into a semiconductor included in a transistor. As the insulating film 141, an inorganic insulating film such as a silicon oxide film, a silicon oxynitride film, or an aluminum oxide film can be used.

[Partition Wall]

For the partition wall 161, an organic insulating material or an inorganic insulating material is used. It is particularly preferable that the partition wall be formed using a photosensitive resin material to have an opening such that a sidewall of the opening has an inclined surface with continuous curvature.

Furthermore, a sealing film with low moisture permeability may be formed between the adhesive layer 109 and the second electrode 175. As the sealing film with low moisture permeability, for example, silicon oxide, silicon nitride, aluminum oxide, or the like can be used.

In a light-emitting device of this embodiment of the present invention, a difference between stress applied to a transistor and stress applied to an organic EL element when physical power is externally applied is small, and the values of the stresses are small. Therefore, damage to the transistor or the organic EL element due to bending or curving can be suppressed, thereby achieving a highly reliable light-emitting device.

This embodiment can be implemented in appropriate combination with any of the structures described in the other embodiments.

(Embodiment 2)

In this embodiment, a light-emitting device of one embodiment of the present invention will be described with reference to FIGS. 3A and 3B, FIGS. 4A and 4B, FIGS. 5A to 5E, and FIGS. 6A to 6E.

The light-emitting device of this embodiment is manufactured by a technique in which an element such as a transistor is manufactured over a formation substrate, and then the element is transferred from the formation substrate to a flexible substrate.

<Structural Example 2 of Light-emitting Device>

Figure 3A:
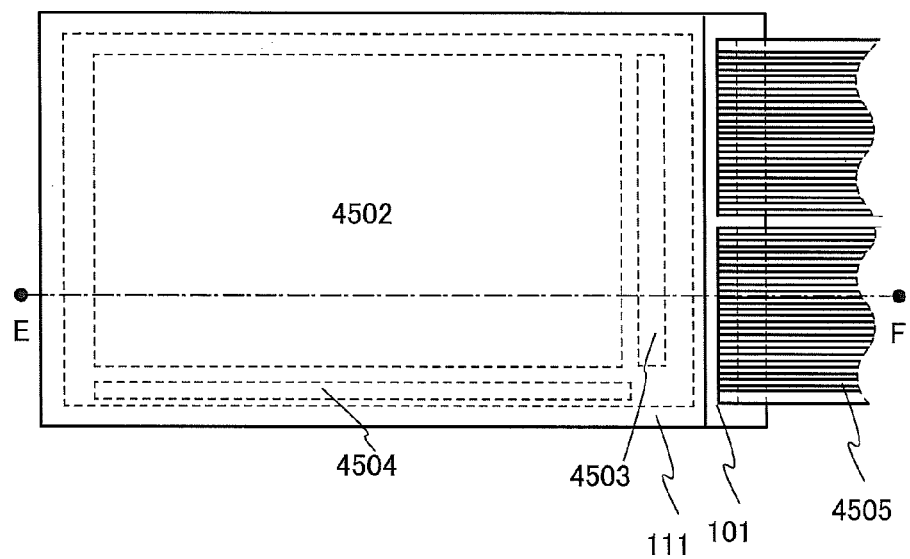
FIGS. 3A and 3B illustrate a light-emitting device of one embodiment of the present invention.
Figure 3B:
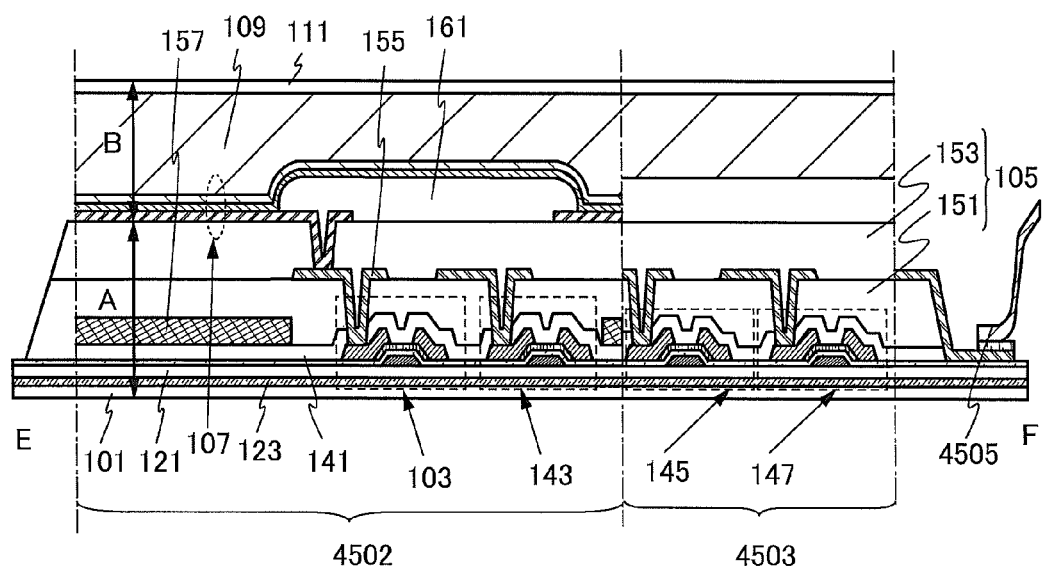

FIGS. 3A and 3B illustrate an example of a specific structure of a light-emitting device to which one embodiment of the present invention is applied. FIG. 3A is a plan view of a light-emitting device of one embodiment of the present invention. The light-emitting device illustrated in FIG. 3A includes the pixel portion 4502, a signal line driver circuit 4503, a scan line driver circuit 4504, and the FPC 4505. FIG. 3B is a cross-sectional view taken along an alternate long and short dash line E-F in FIG. 3A.

The light-emitting device illustrated in FIG. 3B includes, between one surface of the first flexible substrate 101 and one surface of the second flexible substrate 111, the planarization layer 105, the transistor 103 provided on the one surface side of the planarization layer 105, the organic EL element 107 provided on the other surface side of the planarization layer 105, and the adhesive layer 109 for bonding the first flexible substrate 101 and the second flexible substrate 111.

The one surface of the first flexible substrate 101 and the base film 121 are bonded with an adhesive layer 123. A plurality of transistors (the transistor 103, a transistor 143, a transistor 145, and a transistor 147) is provided over the base film 121.

In addition, the insulating film 141 and the planarization layer 105 which cover the plurality of transistors are provided. The planarization layer 105 has a stacked structure of a first planarization layer 151 and a second planarization layer 153. A wiring 155 that electrically connects the source electrode or drain electrode of the transistor 103 and a lower electrode of the organic EL element is provided between the first planarization layer 151 and the second planarization layer 153.

FIG. 3B illustrates an organic EL element with a bottom emission structure. Over the insulating film 141, a color filter 157 is provided in a region overlapping with an emission region of the organic EL element 107. An end portion of the lower electrode of the organic EL element is covered with the partition wall 161.

<Structural Example 3 of Light-emitting Device>

Figure 4A:
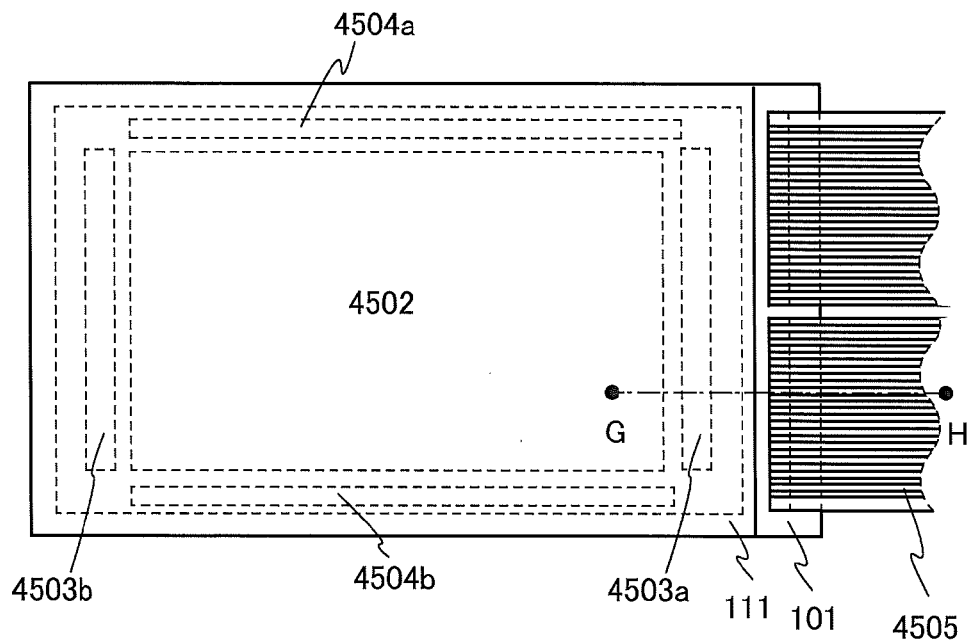
FIGS. 4A and 4B illustrate a light-emitting device of one embodiment of the present invention.
Figure 4B:
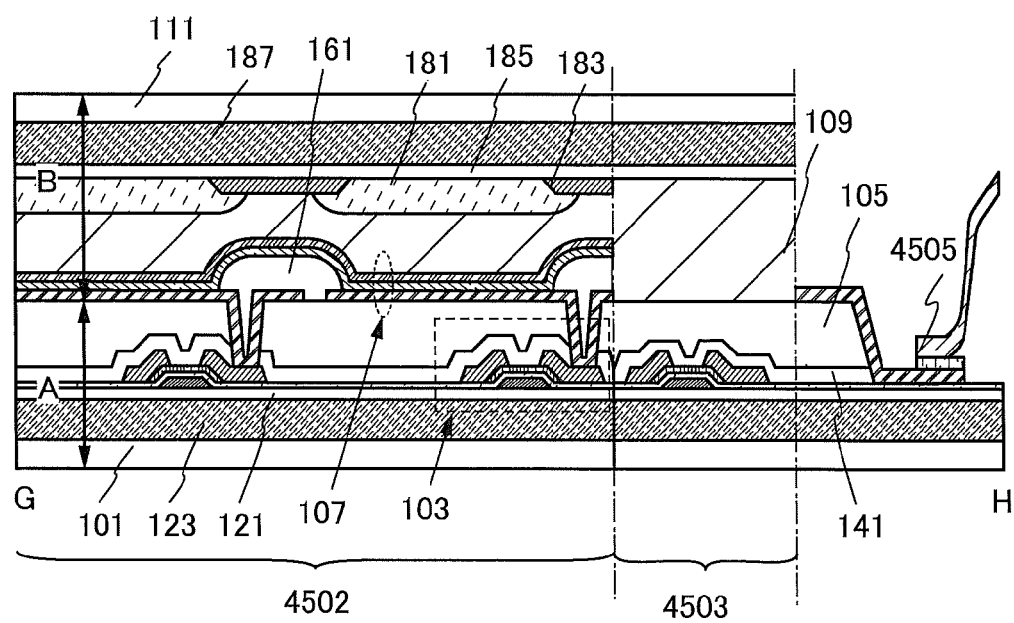

FIGS. 4A and 4B illustrate an example of a specific structure of a light-emitting device to which one embodiment of the present invention is applied. FIG. 4A is a plan view of a light-emitting device of one embodiment of the present invention. The light-emitting device illustrated in FIG. 4A includes the pixel portion 4502, the signal line driver circuit 4503a, the signal line driver circuit 4503b, the scan line driver circuit 4504a, the scan line driver circuit 4504b, and the FPC 4505. FIG. 4B is a cross-sectional view taken along an alternate long and short dash line G-H in FIG. 4A.

The light-emitting device illustrated in FIG. 4B includes, between one surface of the first flexible substrate 101 and one surface of the second flexible substrate 111, the planarization layer 105, the transistor 103 provided on the one surface side of the planarization layer 105, the organic EL element 107 provided on the other surface side of the planarization layer 105, and the adhesive layer 109 for bonding the first flexible substrate 101 and the second flexible substrate 111.

The one surface of the first flexible substrate 101 and the base film 121 are bonded with the adhesive layer 123. A plurality of transistors (the transistor 103 and the like) is provided over the base film 121.

In addition, the insulating film 141 and the planarization layer 105 which cover the plurality of transistors are provided. The partition wall 161 that covers an end portion of the lower electrode of the organic EL element 107 is provided over the planarization layer 105.

In the light-emitting device illustrated in FIG. 4B, a spacer that adjusts a space (also referred to as cell gap) between the first flexible substrate 101 and the second flexible substrate 111 and an auxiliary wiring that is electrically connected to an upper electrode of the organic EL element may be further provided between the partition wall 161 and the second flexible substrate 111.

One surface of the second flexible substrate 111 and a base film 185 are bonded with an adhesive layer 187. Over the base film 185, a color filter 181 provided in a region overlapping with the emission region of the organic EL element 107 and a black matrix 183 provided in a region overlapping with the partition wall 161 exist.

In FIG. 3B and FIG. 4B, the distance from the other surface of the first flexible substrate 101 to the other surface of the planarization layer 105 is denoted by thickness A, and the distance from the other surface of the planarization layer 105 to the other surface of the second flexible substrate 111 is denoted by thickness B.

In the light-emitting device of one embodiment of the present invention, thickness A is 0.8 to 1.2 times (preferably 0.9 to 1.1 times) as large as thickness B, or thickness B is 0.8 to 1.2 times (preferably 0.9 to 1.1 times) as large as thickness A. Therefore, when physical power is externally applied, a difference between pressure applied to the transistor 103 and pressure applied to the organic EL element 107 is small.

In the light-emitting device, a neutral plane (a plane which does not expand or contract) in which distortion of stress, such as compressive stress or tensile stress, due to deformation such as bending is not caused is positioned near both the transistor 103 and the organic EL element 107; for example, the neutral plane is positioned in the planarization layer 105, the transistor 103, or the organic EL element 107. Thus, values of stresses applied to the transistor 103 and the organic EL element 107 can be small. Therefore, damage to the transistor 103 and/or the organic EL element 107 due to bending or curving can be suppressed, thereby achieving a highly reliable light-emitting device.

Examples of materials that can be used for the light-emitting devices illustrated in FIGS. 3A and 3B and FIGS. 4A and 4B are described. Note that the materials of components described above, such as the flexible substrate, are not repeatedly described. The materials for the components of the light-emitting device in any of the other embodiments can be applied to the components of the light-emitting device of this embodiment.

[Adhesive Layer]

A material similar to the material of the adhesive layer 109 can be employed as a material that can be used for the adhesive layer 123 and the adhesive layer 187. In particular, a material used for the side through which light emitted from the light-emitting element is extracted is preferably a material with a high refractive index.

[Color Filter and Black Matrix]

A color filter is provided in order to control the color of light emitted from the organic EL element. For example, in the case where a white light-emitting element is used for a full-color light-emitting device, different organic EL elements which overlap with their respective color filters are used. In that case, the color filters may have three colors of red (R), green (G), and blue (B) or four colors with yellow (Y) in addition to RGB. Each color filter is formed in a desired position with various materials by a printing method, an ink-jet method, an etching method using a photolithography technique, or the like.

A black matrix (also referred to as light-blocking film) is provided between adjacent color filters. A black matrix blocks light emitted from an adjacent organic EL element to prevent color mixture between adjacent organic EL elements. Here, a color filter is provided such that its end portion overlaps with a black matrix, so that light leakage can be suppressed. The black matrix can be formed with a material that blocks light emitted from the organic EL element, and for example, metal or an organic resin can be used. Note that the black matrix may be provided to overlap with a region other than a pixel portion, for example, the black matrix may be provided in a driver circuit portion.

In the light-emitting device illustrated in FIG. 4B, an overcoat covering the color filter 181 and the black matrix 183 may be provided. With the overcoat, an impurity and the like contained in the color filter can be prevented from dispersing into the organic EL element. The overcoat is formed with a material that transmits light emitted from the organic EL element; for example, an inorganic insulating film such as a silicon nitride film or a silicon oxide film, an organic insulating film such as an acrylic film or a polyimide film can be used, and further, a stacked structure of an organic insulating film and an inorganic insulating film may be employed.

In this embodiment, a light-emitting device using a color filter method is described as an example, but one embodiment of the present invention is not limited thereto. For example, a separate coloring method or a color conversion method may be used.

[Base Film]

The base film 185 can be formed with a material similar to the material for the base film 121. The base film 185 is not necessarily provided unless needed.

[Wiring]

A material with high conductivity may be used for the wiring 155, and for example, a material that can be used for an electrode of a transistor can be used.

A spacer over the partition wall 161 can be formed with an inorganic insulating material, an organic insulating material, or a metal material. As the organic insulating material, for example, a negative or positive type photosensitive resin material, a non-photosensitive resin material, or the like can be used. As the metal material, titanium, aluminum, or the like can be used.

Methods for manufacturing the light-emitting devices illustrated in FIGS. 3A and 3B and FIGS. 4A and 4B will be described with reference to FIGS. 5A to 5E and 6A to 6E.

<Manufacturing Method 1 of Light-emitting Device>

A methods for manufacturing the light-emitting device illustrated in FIGS. 3A and 3B will be described with reference to FIGS. 5A to 5E.

Figure 5A:
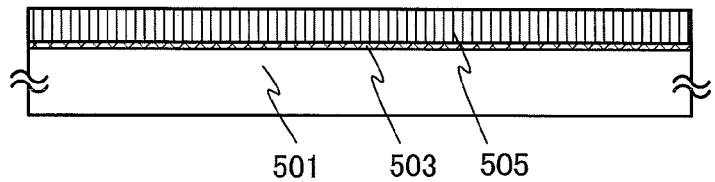
FIGS. 5A to 5E illustrate a method for manufacturing a light-emitting device of one embodiment of the present invention.

First, a separation layer 503 is formed over a formation substrate 501, and a layer 505 to be separated (hereinafter referred to as layer 505) is formed over the separation layer 503 (FIG. 5A).

There is no particular limitation on a layer formed as the layer 505. Here, for the layer 505, a protection layer, the base film 121, the transistor 103, the insulating film 141, the color filter 157, the planarization layer 105, the lower electrode of the organic EL element 107, and the partition wall 161 are formed in this order. For the layer 505, an EL layer of the organic EL element 107, the upper electrode of the organic EL element 107, a sealing film for sealing the organic EL element 107, and the like may be further formed. Alternatively, only the protection layer and the base film 121 may be formed for the layer 505, and after the separation and transferring, the transistor 103 and the like may be formed.

The formation substrate 501 may be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. In the case where the temperature of the heat treatment to be performed later is high, a glass substrate whose strain point is 730° C. or higher is preferably used. Note that by containing a large amount of barium oxide (BaO), a glass substrate which is heat-resistant and more practical can be obtained. Alternatively, crystallized glass or the like may be used.

In the case where a glass substrate is used as the formation substrate 501, an insulating film such as a silicon oxide film, a silicon oxynitride film, a silicon nitride film, or a silicon nitride oxide film is preferably formed between the formation substrate 501 and the separation layer 503, in which case a contamination from the glass substrate can be prevented.

The separation layer 503 has a single-layer structure or a layered structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or InGaZnO (IGZO) can be used for the separation layer 503.

The separation layer 503 can be formed by a sputtering method, a plasma CVD method, a coating method, a printing method, or the like. Note that a coating method includes a spin coating method, a droplet discharge method, and a dispensing method.

In the case where the separation layer 503 has a single layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer 503 has a stacked structure including a layer containing tungsten and a layer containing an oxide of tungsten, it may be utilized that the layer containing tungsten is formed first and an insulating layer formed of oxide is formed thereover so that a layer containing an oxide of tungsten is formed at the interface between the tungsten layer and the insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten. Plasma treatment or heat treatment may be performed in an atmosphere of oxygen, nitrogen, nitrous oxide alone, or a mixed gas of any of these gasses and another gas. Surface condition of the separation layer 503 is changed by the plasma treatment or heat treatment, whereby adhesion between the separation layer 503 and the protection layer formed later can be controlled.

The protection layer included in the layer 505 preferably has a single-layer structure or a layered structure including any of silicon nitride, silicon oxynitride, silicon nitride oxide, and the like.

The protection layer can be formed by a sputtering method, a plasma CVD method, a coating method, a printing method, or the like. For example, the protection layer is formed at a temperature higher than or equal to 250° C. and lower than or equal to 400° C. by a plasma CVD method, whereby a dense film having very low water permeability can be formed. The thickness of the protection layer is preferably greater than or equal to 10 nm and less than or equal to 3000 nm, further preferably greater than or equal to 200 nm and less than or equal to 1500 nm. Note that in the case where the base film 121 also functions as the protection layer, the protection layer is not necessarily provided.

Figure 5B:
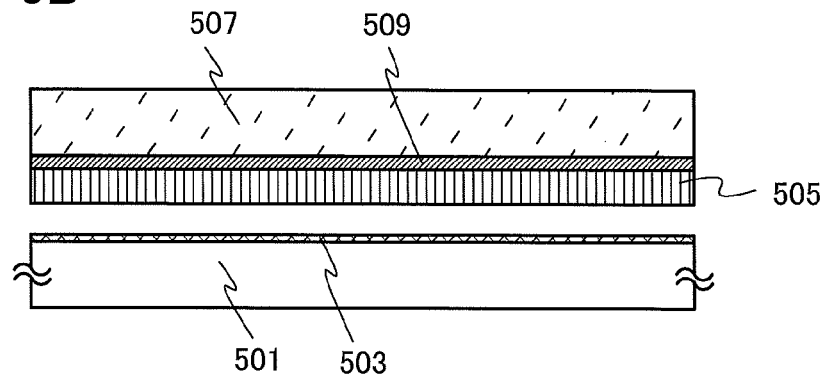

Next, the layer 505 and a temporary supporting substrate 507 are bonded with an adhesive 509 for separation, and the layer 505 is separated from the formation substrate 501 along the separation layer 503. Accordingly, the layer 505 is placed on the temporary supporting substrate 507 side (FIG. 5B).

The temporary supporting substrate 507 may be a glass substrate, a quartz substrate, a sapphire substrate, a ceramic substrate, a metal substrate, or the like. Alternatively, a plastic substrate that can withstand a processing temperature of this embodiment may be used, or a flexible film-like substrate may be used.

An adhesive with which the temporary supporting substrate 507 and the layer 505 can be chemically or physically separated when necessary, such as an adhesive that is soluble in water or a solvent or an adhesive which is capable of being plasticized upon irradiation of UV light or the like, is used as the adhesive 509 for separation.

Any of various methods can be used as appropriate as the process for transferring the layer to be separated to the temporary supporting substrate. For example, in the case where a layer including a metal oxide film is formed as the separation layer on the side in contact with the layer to be separated, the metal oxide film is embrittled by crystallization, whereby the layer to be separated can be separated from the formation substrate. Alternatively, in the case where an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate.

Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods is combined, the transfer process can be conducted easily. For example, separation can be performed with physical force (by a machine or the like) after performing laser light irradiation, etching on the separation layer with a gas, a solution, or the like, or mechanical removal with a sharp knife, scalpel, or the like so that the separation layer and the layer to be separated can be easily separated from each other.

Alternatively, separation of the layer to be separated from the formation substrate may be carried out after a liquid is made to penetrate an interface between the separation layer and the layer to be separated. Further alternatively, the separation may be performed while pouring a liquid such as water during the separation.

As another separation method, in the case where the separation layer 503 is formed using tungsten, it is preferable that the separation be performed while etching the separation layer 503 using a mixed solution of ammonium water and a hydrogen peroxide solution.

Figure 5C:
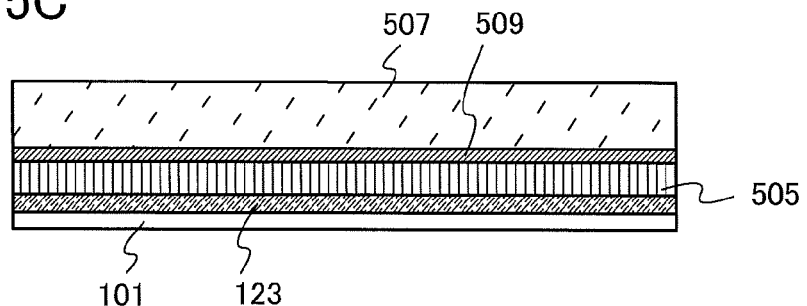

Next, with the adhesive layer 123 which is formed with an adhesive different from the adhesive 509 for separation, the first flexible substrate 101 is bonded to the separation layer 503 exposed by the separation from the formation substrate 501 or the layer 505 in which the protection layer is exposed by the separation from the formation substrate 501 (FIG. 5C).

Figure 5D:
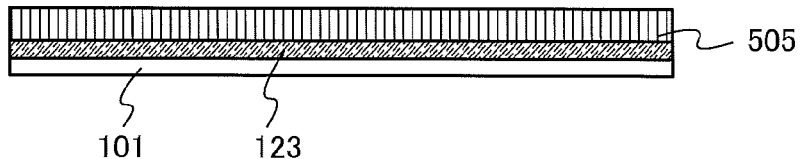

After that, the temporary supporting substrate 507 is removed by dissolving or plasticizing the adhesive 509 for separation. After the temporary supporting substrate 507 is removed, the adhesive 509 for separation is removed using water, a solvent, or the like such that the lower electrode of the organic EL element 107 is exposed (FIG. 5D).

Through the above steps, the layer 505 which includes components from the transistor 103 to the lower electrode of the organic EL element 107 can be formed over the first flexible substrate 101.

Figure 5E:
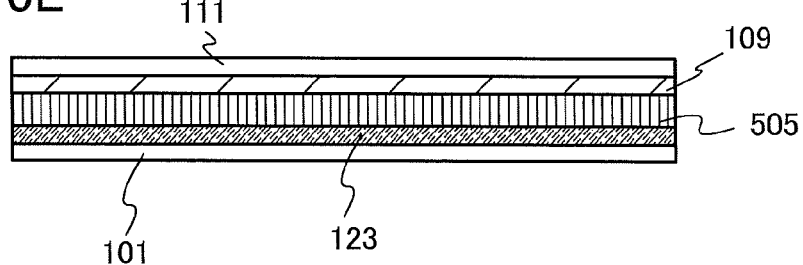

After that, the EL layer and the upper electrode (which are not illustrated) of the organic EL element 107 are formed, and then the second flexible substrate 111 is bonded thereto with the adhesive layer 109 (FIG. 5E).

Finally, the FPC 4505 is attached to each electrode of an input-output terminal portion with the use of an anisotropic conductive member. An IC chip or the like may be mounted if necessary.

In the above manner, the light-emitting device illustrated in FIGS. 3A and 3B can be manufactured.

Note that the separation layer is not necessarily provided in the case where separation at an interface between the formation substrate and the layer to be separated is possible. For example, a glass substrate is used as the formation substrate 501, an organic resin film such as a polyimide film is formed in contact with the glass substrate, and the protection layer, the base film, the transistor, and the like are formed over the organic resin film. In this case, heating the organic resin film enables the separation at the interface between the formation substrate 501 and the organic resin film. Then, the organic resin film and the first flexible substrate 101 may be bonded with the adhesive layer 123. Alternatively, separation at the interface between a metal layer and the organic resin film may be performed in the following manner; the metal layer is provided between the formation substrate and the organic resin film and current is made to flow in the metal layer so that the metal layer is heated.

<Manufacturing Method 2 of Light-emitting Device>

A methods for manufacturing the light-emitting device illustrated in FIGS. 4A and 4B will be described with reference to FIGS. 6A to 6E.

Figure 6A:
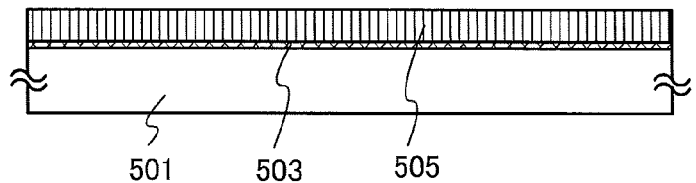
FIGS. 6A to 6E illustrate a method for manufacturing a light-emitting device of one embodiment of the present invention.

First, the separation layer 503 is formed over a formation substrate 501, and the layer 505 is formed over the separation layer 503 (FIG. 6A).

Here, as the layer 505, a protection layer, the base film 121, the transistor 103, the insulating film 141, the planarization layer 105, the lower electrode of the organic EL element 107, the partition wall 161, and the EL layer and the upper electrode of the organic EL element 107 are formed in this order. In addition, a sealing film that seals the organic EL element 107 may be formed.

Figure 6B:
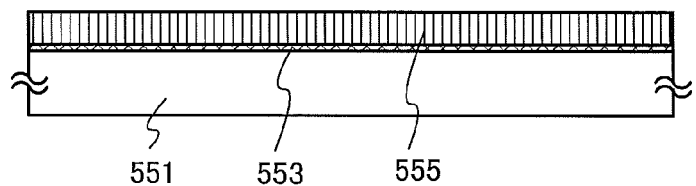

A separation layer 553 is formed over a formation substrate 551, and a layer 555 to be separated is formed over the separation layer 553 (FIG. 6B).

Here, for the layer 555 to be separated, the base film 185, the black matrix 183, and the color filter 181 are formed in this order. A protection layer may be formed between the separation layer 553 and the base film 185.

Figure 6C:
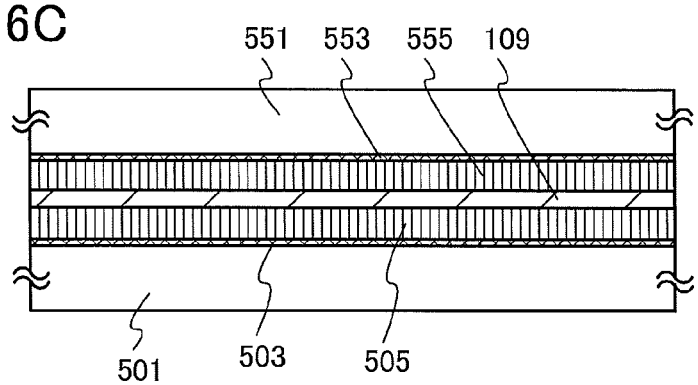

Next, the formation substrate 501 and the formation substrate 551 are bonded with the adhesive layer 109 (FIG. 6C).

Figure 6D:
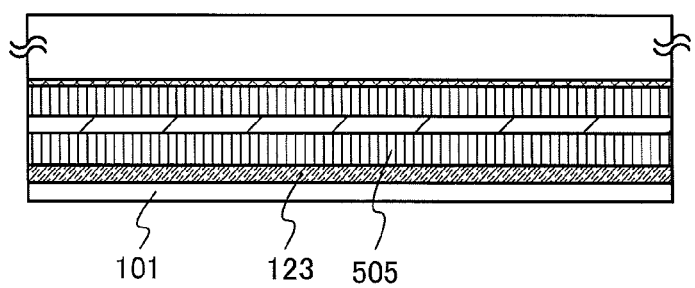

Then, the layer 505 is separated from the formation substrate 501 along the separation layer 503. Next, with the adhesive layer 123, the first flexible substrate 101 is bonded to the layer 505 with the separation layer 503 or the protection layer (or the base film 121) exposed by the separation from the formation substrate 501 (FIG. 6D).

Figure 6E:
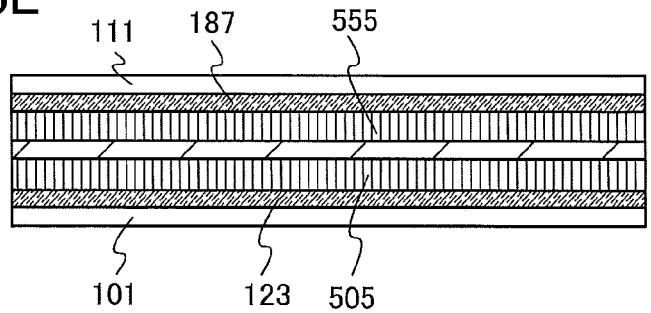

Similarly, the layer 555 is separated from the formation substrate 551 along the separation layer 553. Next, with the adhesive layer 187, the second flexible substrate 111 is bonded to the layer 555 with the separation layer 553 or the base film 185 exposed by the separation from the formation substrate 551 (FIG. 6E).

Finally, the FPC 4505 is attached to each electrode of an input-output terminal portion with use of an anisotropic conductive member. An IC chip or the like may be mounted if necessary.

In the above manner, the light-emitting device illustrated in FIGS. 4A and 4B can be manufactured.

This embodiment can be implemented in appropriate combination with any of the structures described in the other embodiments.

(Embodiment 3)

In this embodiment, a light-emitting device of one embodiment of the present invention will be described with reference to FIG. 7, FIG. 8, and FIG. 9.

<Structural Example 4 of Light-emitting Device>

Figure 7:
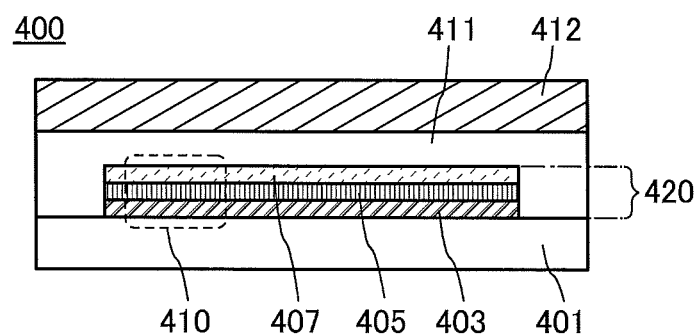
FIG. 7 illustrates a light-emitting device of one embodiment of the present invention.

FIG. 7 is a schematic cross-sectional view of a light-emitting device 400 described as an example in this embodiment.

The light-emitting device 400 includes an element layer 420 including a light-emitting element 410 provided over the substrate 401, a first protection layer 411 covering the element layer 420, and a second protection layer 412 provided over the first protection layer 411.

The substrate 401 has flexibility. The light-emitting element 410 is formed over an insulating surface of the substrate 401.

The light-emitting element 410 is a stack in which a first electrode 403, an EL layer 405, and a second electrode 407 are stacked in this order over the substrate 401. The EL layer 405 includes at least a light-emitting organic compound. At least one of the first electrode 403 and the second electrode 407 has a light-transmitting property with respect to light emitted from the EL layer 405. The light-emitting element 410 can emit light by voltage application between the first electrode 403 and the second electrode 407 with the EL layer 405 provided therebetween.

Here, the element layer 420 is a layer including the light-emitting element 410. Note that the element layer 420 includes at least the light-emitting element 410 and may include a component other than the light-emitting element 410 (e.g., a transistor or a wiring), as described in the following example.

The first protection layer 411 is a layer for protecting the element layer 420 and is provided to cover the element layer 420. The thickness of the first protection layer 411 is greater than or equal to 0.1 μm and less than 100 μm.

Here, the thickness of the first protection layer 411 in a region overlapping with the element layer 420 may differ from the thickness of the first protection layer 411 in a region where the element layer 420 is not provided. Similarly, in the case where the top surface of the element layer 420 is not flat, the thickness of the first protection layer 411 is not constant. Therefore, the smallest thickness of the first protection layer 411 is within the above thickness range.

The second protection layer 412 is provided over the first protection layer 411. The second protection layer 412 has a higher hardness at least at the surface that does not face the element layer 420 than a surface of the first protection layer 411.

For example, in Pencil Test (pencil hardness test) standardized by ISO15184, the surface of the second protection layer 412, which does not face the element layer 420, has a hardness of H or harder, preferably 2H or harder, more preferably 3H or harder.

Note that in the case where the pencil hardness test is employed as a method for measuring the hardness, when the hardness of the surface of the second protection layer 412, which does not face the element layer 420, is determined to be the same level as the first protection layer 411, other hardness indexes (e.g., Vickers hardness or Knoop hardness) can be used for comparison.

Here, since the surface of the first protection layer 411 is softer than the surface of the second protection layer 412, which does not face the element layer 420, in the case where mechanical pressure is locally applied from the second protection layer 412 side or the light-emitting device 400 is bent, stress applied to the element layer 420 can be reduced. Here, when the thickness of the first protection layer 411 is less than 0.1 μm, there is a possibility that the light-emitting element 410 (or a transistor, a wiring, or the like) included in the element layer 420 is damaged because the stress cannot be sufficiently reduced. On the other hand, when the thickness of the first protection layer 411 is greater than or equal to 100 μm, there is a possibility that the light-emitting device 400 loses its flexibility or the light-emitting device 400 winds up.

Thus, the first protection layer 411 is formed to be sufficiently thin, stress applied to the element layer 420 can be reduced and the light-emitting device 400 can have high flexibility. With the second protection layer 412 which is provided on the outermost surface of the light-emitting device and has a high hardness at least at the surface that does not face the element layer 420, damage to an element included in the element layer 420, such as the light-emitting element 410, by mechanical pressure externally applied can be suppressed even in the case where the first protection layer 411 is formed to be thin, whereby the light-emitting device 400 can have high flexibility and high mechanical strength.

Note that another protection layer may be provided between the first protection layer 411 and the second protection layer 412. For example, an organic resin is used for the first protection layer 411, a thin film or the like is provided over the first protection layer 411, and an inorganic insulating film is formed as the second protection layer 412 over a surface of the thin film that does no face the element layer 420. With the other protection layer between the first protection layer 411 and the second protection layer 412, mechanical strength of the light-emitting device 400 can be further improved.

<Structural Example 5 of Light-emitting Device>

Furthermore, a third protection layer and a fourth protection layer may be provided below the element layer 420 including the light-emitting element 410 instead of the substrate 401.

Figure 8:
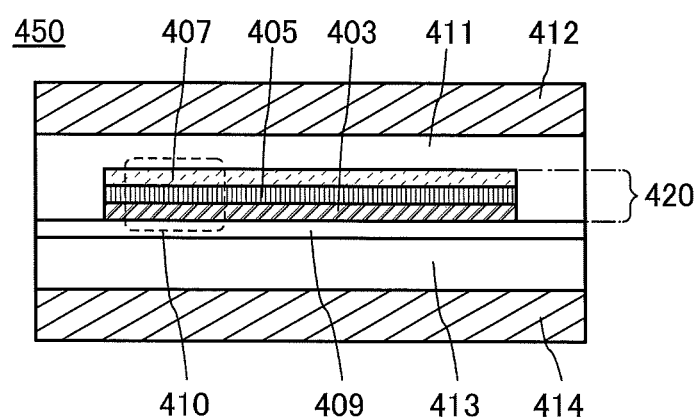
FIG. 8 illustrates a light-emitting device of one embodiment of the present invention.

A difference between the light-emitting device 400 described in Structural Example 4 and a light-emitting device 450 illustrated in FIG. 8 is the structure of a layer under the element layer 420.

In the light-emitting device 450, the element layer 420 is provided over an insulating layer 409, a third protection layer 413 is provided below the element layer 420 with the insulating layer 409 provided therebetween, and a fourth protection layer 414 is provided under the third protection layer 413.

The thickness of the third protection layer 413 is greater than or equal to 0.1 μm and less than 100 μm. The hardness of the fourth protection layer 414 has a higher hardness at least at the lower surface (i.e., the surface that does not face the element layer 420) than the third protection layer 413.

For example, the lower surface of the fourth protection layer 414 has a hardness of H or harder, preferably 2H or harder, more preferably 3H or harder.

With the above-described structure where the element layer 420 is sandwiched between a stack of the first protection layer 411 and the second protection layer 412 and a stack of the third protection layer 413 and the fourth protection layer 414, damage to components of the element layer 420 due to pressure from any plane of the light-emitting device 450 can be suppressed, whereby a highly reliable light-emitting device whose mechanical strength is improved can be achieved.

Here, the third protection layer 413 is preferably faulted with the same material as the first protection layer 411, in which case a common material can be used at the formation. Similarly, the fourth protection layer 414 is preferably formed with the same material as the second protection layer 412.

Note that the thickness of the first protection layer 411 may differ from that of the third protection layer 413. Specifically, since the thickness of the first protection layer 411 needs to be large enough to cover at least the element layer 420, the first protection layer 411 may have a larger thickness than the third protection layer 413.

As described in Structural Example 4, another protection layer may be provided between the third protection layer 413 and the fourth protection layer 414 so that mechanical strength of the light-emitting device 450 is increased.

<Structural Example 6 of Light-emitting Device>

Here, a fifth protection layer that exhibits photocatalytic activity may be provided on the outermost surface of the second protection layer 412 or the outermost surface of the fourth protection layer 414. In particular, the fifth protection layer is preferably provided on the light extraction side.

Figure 9:
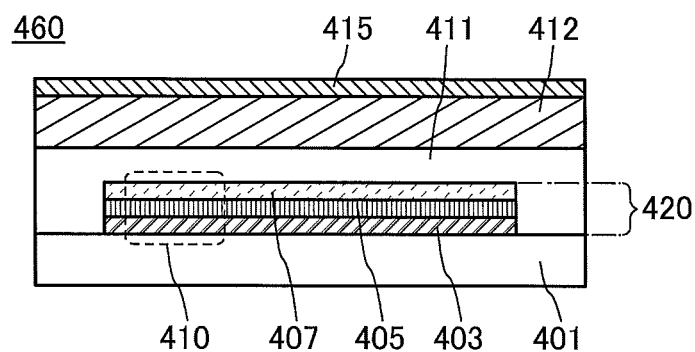
FIG. 9 illustrates a light-emitting device of one embodiment of the present invention.

A light-emitting device 460 illustrated in FIG. 9 differs from the light-emitting device 400 illustrated in FIG. 7 in that a fifth protection layer 415 is provided in contact with the surface of the second protection layer 412, which does not face the element layer 420.

The fifth protection layer 415 includes a material that exhibits photocatalytic activity. Examples of the material are metal oxides such as titanium oxide and zinc oxide.

The fifth protection layer 415 can be formed by a sputtering method, a sol-gel method, a spin coating method, a dip method, a printing method, or the like.

An organic substance attached to a surface of the fifth protection layer 415 can be decomposed by strong oxidation-reduction reaction of the fifth protection layer 415; thus, contamination of the surface of the light-emitting device 460, which is caused by sebum or the like, can be suppressed. Furthermore, oil contamination is prevented from remaining by a super hydrophilic effect of the fifth protection layer 415; for example, contamination of the surface of the light-emitting device 460 can be easily removed only by exposing the surface to running water. As a result, the number of times mechanical pressure is applied to the light-emitting device 460, for example, by wiping off an organic substance attached or fixed on the surface of the light-emitting device 460, can be reduced. Thus, a defect such as a crack formed on the surface of the light-emitting device 460 or damage to an element for forming the element layer 420, such as the light-emitting element 410, can be suppressed.

<Formation Method of Element Layer>

A method for forming an element layer including a light-emitting element over an insulating surface having flexibility will be described below. Note that description of the method for manufacturing the light-emitting device in any of the other embodiments can also be referred to for.

An element layer includes at least a light-emitting element and may include elements other than the light-emitting element, such as a wiring electrically connected to the light-emitting element and a transistor used for a circuit for controlling light emission of the light-emitting element.

Here, a support provided with an insulating surface over which an element layer is formed is called base material. For example, in Structural Example 4 and Structural Example 6, the substrate 401 corresponds to the base material. In Structural Example 5, the stack of the fourth protection layer 414, the third protection layer 413, and the insulating layer 409 corresponds to the base material.

As a method for forming an element layer over a base material provided with an insulating surface having flexibility, there are a method in which an element layer is formed directly over a base material, and a method in which an element layer is formed over a supporting base material that has a different stiffness from a base material, and then the element layer is separated from the supporting base material and transferred to the base material.

In the case where a material of the base material can withstand heating temperature in the process for forming the element layer, it is preferable that the element layer be formed directly over the base material, in which case a manufacturing process can be simplified. At this time, the element layer is preferably formed in a state where the base material is fixed to the supporting base material, in which case transfer of the element layer in a device and between devices can be easy.

In the case of employing the method in which the element layer is formed over the supporting base material and then transferred to the base material, first, a separation layer (which corresponds to the separation layer 503 in Embodiment 2, for example) and an insulating layer (which corresponds to the protection layer in Embodiment 2, for example) are stacked over a supporting base material (which corresponds to the formation substrate 501 in Embodiment 2, for example), and then the element layer is formed over the insulating layer. Then, the element layer is separated from the supporting base material and then transferred to the base material. At this time, a material is selected so that separation at an interface between the supporting base material and the separation layer, at an interface between the separation layer and the insulating layer, or in the separation layer occurs.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride layer be used as the insulating layer over the separation layer. The use of the high-melting-point metal material is preferable because the degree of freedom of the process for forming the element layer can be increased.

The separation may be performed by application of mechanical power, etching of the separation layer, by dripping of a liquid into part of the separation interface to penetrate the entire separation interface, or the like. Alternatively, separation may be performed by heating the separation interface by utilizing a difference in coefficient of thermal expansion.

Note that the above methods can be used in the case where a color filter or the like is formed over the base material having flexibility as described in the following embodiment.

In the case of bonding a base material provided with an element layer and a base material provided with a color filter, the bonding is preferably performed with the use of a curable material as the first protection layer 411. Alternatively, the bonding may be performed outside a region where the first protection layer 411 is formed, with the use of a curable material.

Alternatively, the following may be performed: a supporting base material provided with an element layer and a supporting base material provided with a color filter are bonded in advance, and the element layer and the color filter are separated from the respective supporting base materials. By the bonding is performed in a state where the element layer and the color filter are formed over the respective supporting base materials, alignment accuracy at the bonding can be improved.

<Materials and Formation Methods>

A material and a formation method that can be used for each component described above will be described below. Note that detailed explanation on the structure described in Embodiment 1 is not made. The materials for the components of the light-emitting device in any of the other embodiments can be applied to the components of the light-emitting device of this embodiment.

[Substrate]

An organic resin, a glass material that is thin enough to have flexibility, or the like can be used for the substrate 401. In the case of a light-emitting device with a bottom emission structure or a dual emission structure, a material having a light-transmitting property with respect to light emitted from the EL layer 405 is used for the substrate 401.

Here, particularly in the case where a light-emitting device with a top emission structure, a conductive substrate including a metal or an alloy material is preferably used for the substrate 401, in which case dissipation of heat generated from a light-emitting element to be formed later can be increased.

It is preferable to use a substrate subjected to insulation treatment in such a manner that a surface of the conductive substrate is oxidized or an insulating film is formed on the surface. For example, an insulating film may be formed over the surface of the conductive substrate by an electrodeposition method, a coating method such as a spin coating method or a dip method, a printing method such as a screen printing method, or a deposition method such as an evaporation method or a sputtering method. Alternatively, the surface of the substrate 401 may be oxidized by a variety of methods, such as a method of exposing to or heating in an oxygen atmosphere or an anodic oxidation method.

In the case where the surface of the substrate 401 has projections, a planarization layer may be provided in order to form a flat insulating surface which covers the projections. An insulating material, such as an organic material or an inorganic material, can be used for the planarization layer. The planarization layer can be formed by a deposition method such as a sputtering method, a coating method such as a spin-coating method or a dip method, a discharging method such as an ink-jet method or a dispensing method, a printing method such as a screen printing method, or the like.

[Light-emitting Element]

The structure of the organic EL element 107 described in Embodiment 1 can be applied to the structure of the light-emitting element 410.

[First Protection Layer and Third Protection Layer]

For the first protection layer and the third protection layer, a curable material, such as a photocurable organic resin, a curable resin of a two-component-mixture type, or a thermosetting organic resin, a gel, or the like can be used. For example, an epoxy resin, an acrylic resin, a silicone resin, a phenol resin, polyimide, polyvinyl chloride (PVC), polyvinyl butyral (PVB), or ethylene vinyl acetate (EVA) can be used. A material with low moisture permeability, such as an epoxy resin, is particularly preferred.

Furthermore, a drying agent may be included in the first protection layer 411 and the third protection layer 413. As the drying agent, for example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used as the drying agent. In the case where the drying agent is applied to a lighting device, when a granular drying agent is employed, light emitted from the light-emitting element 410 is diffusely reflected by the drying agent; thus, a highly reliable light-emitting device with improved viewing angle dependence can be achieved.

[Second Protection Layer and Fourth Protection Layer]

For the second protection layer and the fourth protection layer, a material that can be used for the flexible substrate described in Embodiment 1 can be used, for example.

Alternatively, a material obtained by stacking a plurality of layers can be used for the second protection layer and the fourth protection layer. For example, a material obtained by stacking two or more kinds of layers formed of an organic resin, a material obtained by stacking a layer formed of an organic resin and a layer formed of an inorganic material, or a material obtained by stacking two or more kinds of layers formed of an inorganic material is used. In the case of using a stacked layer of a plurality of layers, a material having a higher hardness than at least the first protection layer or the third protection layer is selected as a material for a layer positioned on the surface side which does not face the light-emitting element 410. With a layer formed of an inorganic material, moisture and the like are prevented from entering the inside of the light-emitting device, leading to improvement in the reliability of the light-emitting device.

As the inorganic material, an oxide material, a nitride material, or an oxynitride material of a metal or a semiconductor, or the like can be used. For example, silicon oxide, silicon nitride, silicon oxynitride, aluminum oxide, aluminum nitride, or aluminum oxynitride may be used.

For example, in the case where a layer formed of an organic resin and a layer formed of an inorganic material are stacked, the layer formed of an inorganic material can be formed over or under the layer formed of an organic resin by a sputtering method, a CVD method, a coating method, or the like.

Alternatively, glass that is thin enough to have flexibility may be used for the second protection layer and the fourth protection layer. Specifically, it is preferable to use a layer obtained by stacking an organic resin layer, an adhesive layer, and a glass layer in this order from the side close to the light-emitting element 410. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and high flexibility. The thickness of the organic resin layer is greater than or equal to 10 μm and less than or equal to 200 μm, preferably greater than or equal to 20 μm and less than or equal to 50 μm. With such an organic resin layer in contact with the glass layer, occurrence of a break or a crack in the glass layer can be suppressed and mechanical strength can be improved. Such a composite material of a glass material and an organic resin is used for the second protection layer or the fourth protection layer, whereby a flexible light-emitting device having extremely high reliability can be achieved.

This embodiment can be implemented in appropriate combination with any of the other embodiments described in this specification.

(Embodiment 4)

In this embodiment, a structural example of a display device will be described as a specific example of the light-emitting device of one embodiment of the present invention. Note that description of the same portions as those in the above embodiments is omitted or simplified.

<Structural Example 7 of Light-emitting Device>

In this structural example, a display device with a top emission structure will be described.

FIG. 10A is a schematic top view of a display device 270 described in this structural example.

The display device 270 includes a display portion 271, a scan line driver circuit 272, and a signal line driver circuit 273 over a top surface of the third protection layer 413 over the fourth protection layer 414. The first protection layer 411 is provided to cover the display portion 271 and the second protection layer 412 is provided over the first protection layer 411. An external connection terminal 274 that is electrically connected to the scan line driver circuit 272 and the signal line driver circuit 273 is provided over the third protection layer 413. By an FPC 275 that is electrically connected to the external connection terminal 274, power supply potentials and signals, such as driving signals, for driving the scan line driver circuit 272, the signal line driver circuit 273, and the like can be externally input.

FIG. 10B is a schematic cross-sectional view along the line I-J and K-L of FIG. 10A, which passes through regions including the external connection terminal 274, the scan line driver circuit 272, and the display portion 271.

The insulating layer 409 is provided over the third protection layer 413. The external connection terminal 274 and the element layer 420 including the light-emitting element 410 and the scan line driver circuit 272 (and the signal line driver circuit 273) are provided over the insulating layer 409.

The external connection terminal 274 is formed using a conductive layer included in a transistor or a light-emitting element in the display device 270. In this structural example, the external connection terminal 274 includes a stack of a conductive layer used as gates of the transistors and a conductive layer used as electrodes (source electrodes or drain electrodes). The external connection terminal 274 preferably includes a stack of a plurality of conductive layers in this manner because the strength can be increased. A connector 276 is provided in contact with the external connection terminal 274. The FPC 275 is electrically connected to the external connection terminal 274 through the connector 276. The connector 276 can be formed using a paste-form or sheet-form material that is obtained by mixing metal particles to a thermosetting resin and exhibits anisotropic conductivity by thermocompression bonding. As the metal particles, particles in which two or more kinds of metals are layered, for example, nickel particles coated with gold are preferably used.

In FIG. 10B, the scan line driver circuit 272 includes an NMOS circuit in which transistors 211 and 212, which are n-channel transistors, are used in combination, as an example. The scan line driver circuit 272 is not limited to an NMOS circuit and may have a variety of circuits such as a CMOS circuit in which an n-channel transistor and a p-channel transistor are used in combination or a PMOS circuit formed of p-channel transistors. Note that the same applies to the signal line driver circuit 273. Although a driver-integrated structure in which the scan line driver circuit 272 and the signal line driver circuit 273 are formed over an insulating surface provided with the display portion 271 is described in this structural example, the scan line driver circuit 272 or the signal line driver circuit 273, or both may be formed over a surface different from the insulating surface provided with the display portion 271.

FIG. 10B illustrates a cross-sectional structure of one pixel as an example of the display portion 271. The pixel includes a switching transistor 213, a current control transistor 214, and the first electrode 403 that is electrically connected to an electrode (a source electrode or a drain electrode) of the current control transistor 214. An insulating layer 219 is provided to cover an end portion of the first electrode 403.

Note that there is no particular limitation on the structures of the transistors included in the display portion 271, the scan line driver circuit 272, and the signal line driver circuit 273.

The structure of the light-emitting element 410 in the above embodiment can be applied to the structure of the light-emitting element 410 in this embodiment. Since the display device 270 described in this structural example has a top emission structure, a light-transmitting material is used for the second electrode 407, and a reflective material is used for the first electrode 403.

Here, the insulating layer 409 can suppress dispersion of impurities contained in the third protection layer 413 and the fourth protection layer 414. It is preferable that an insulating layer 216 and an insulating layer 218 each in contact with semiconductor layers of the transistors suppress dispersion of an impurity into the semiconductor layer. These insulating layers can be formed using, for example, oxide or nitride of a semiconductor such as silicon, or oxide or nitride of metal such as aluminum. Alternatively, a stack of such an inorganic insulating material or a stack of such an inorganic insulating material and an organic insulating material may be used. An insulating layer 217 functions as a planarization film for reducing surface roughness caused by the transistors.

Here, a layer including the transistors and the light-emitting element 410 corresponds to the element layer 420. In this structural example, a stack of components from the top surface of the insulating layer 409 to the second electrode 407 corresponds to the element layer 420.

An insulating layer 223 is provided on a surface of the second protection layer 412, which faces the light-emitting element 410. A color filter 221 is provided over the insulating layer 223 in the position overlapping with the light-emitting element 410.

A material that does not easily permeate an impurity, such as water and oxygen, is preferably used for the insulating layer 223. A material similar to that of the insulating layer 409 can be used for the insulating layer 223.

A black matrix 222 is provided between adjacent color filters 221. Note that the black matrix 222 may be provided in a region other than the display portion 271; for example, the black matrix 222 may be provided in the scan line driver circuit 272.

An overcoat may be formed to cover the color filter 221 and the black matrix 222. The overcoat protects the color filter 221 and the black matrix 222 and suppresses the diffusion of impurities included in the color filter 221 and the black matrix 222.

The first protection layer 411 is provided over the element layer 420. The second protection layer 412 is provided over the first protection layer 411 with the insulating layer 223 provided therebetween. With such a structure, damage to the element layer 420 by mechanical pressure externally applied can be suppressed, whereby the display device 270 with high reliability can be achieved.

The element layer 420 is provided over the third protection layer 413 with the insulating layer 409 provided therebetween. The fourth protection layer 414 is provided on the surface of the third protection layer 413, which does not face the element layer 420. Thus, the mechanical strength on the rear surface of the display device 270 is increased.

Accordingly, stress applied to the element layer 420 can be reduced and the display device 270 itself can have high flexibility because the first protection layer 411 is formed to be sufficiently thin. With the second protection layer 412 which is provided on the outermost surface of the display device and has a high hardness at least at the surface that does not face the element layer 420, damage to elements for forming the element layer 420, such as the light-emitting element 410, can be suppressed when the display device 270 is bent or mechanical pressure is externally applied to the display device 270 even in the case where the first protection layer 411 is formed to be thin, whereby the display device 270 can have high flexibility and high mechanical strength.

With the structure where the element layer 420 is sandwiched between a stack of the first protection layer 411 and the second protection layer 412 and a stack of the third protection layer 413 and the fourth protection layer 414, damage to components of the element layer 420 due to pressure from any plane of the display device 270 can be suppressed, whereby a highly reliable display device whose mechanical strength is improved can be achieved.

<Structural Example 8 of Light-emitting Device>

In this structural example, a display device with a bottom emission structure will be described. Note that description of the same portions as those described in Structural Example 7 is omitted or simplified.

Figure 11:
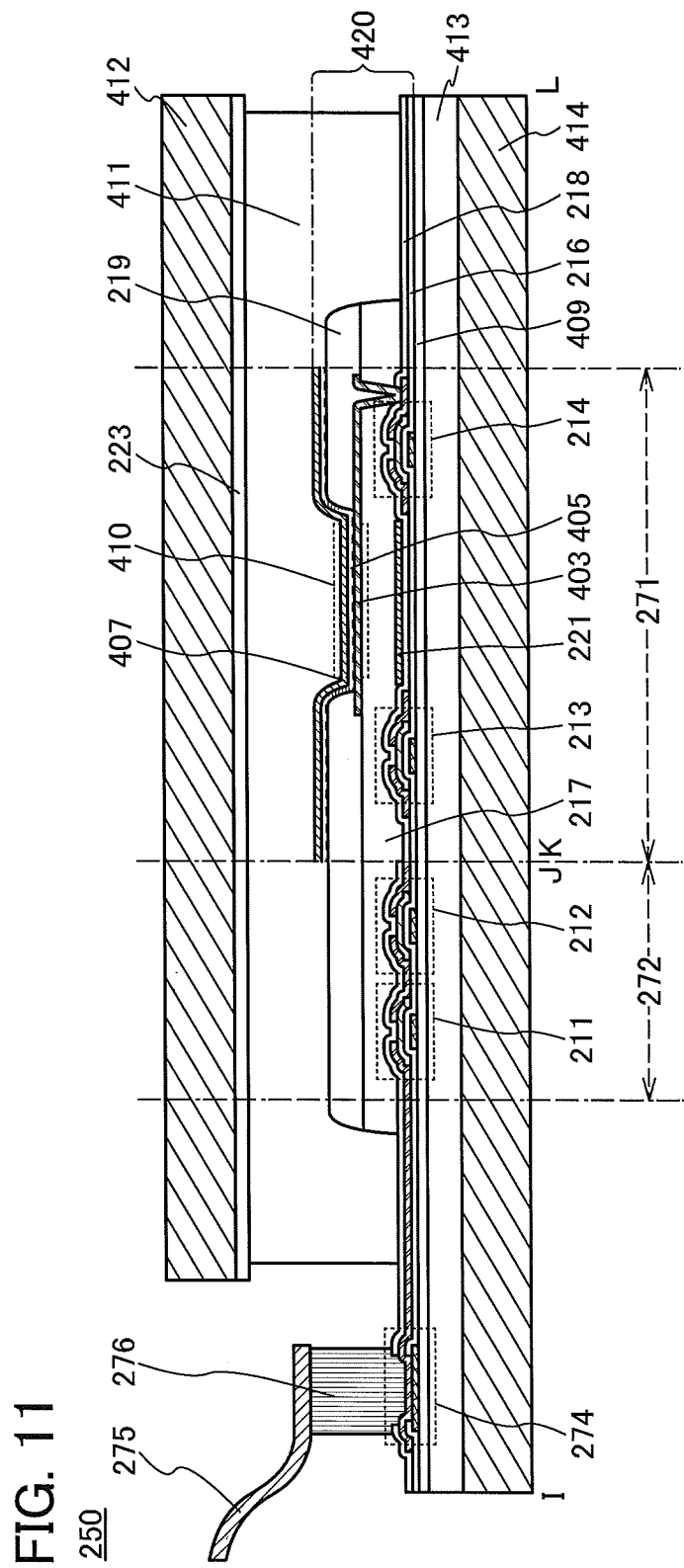
FIG. 11 illustrates a display device of one embodiment of the present invention.

FIG. 11 is a schematic cross-sectional view of a display device 250 described in this structural example.

The display device 250 differs from the display device 270 described in Structural Example 7 in that the position of the color filter 221 is closer to the surface provided with the element layer 420 than the light-emitting element 410.

In the light-emitting element 410, a light-transmitting material is used for the first electrode 403, and a reflective material is used for the second electrode 407. Accordingly, light from the EL layer 405 is emitted to the third protection layer 413 side.

Further, the color filter 221 is provided over the insulating layer 218 covering transistors to overlap with the light-emitting element 410. The insulating layer 217 is provided to cover the color filter 221.

Here, for the insulating layer 217, the insulating layer 218, the insulating layer 216, the insulating layer 409, the third protection layer 413, and the fourth protection layer 414, a material having a light-transmitting property with respect to light emitted from the EL layer 405 is used.

The display device described in this embodiment has both high flexibility and high mechanical strength.

This embodiment can be implemented in appropriate combination with any of the other embodiments described in this specification.

(Embodiment 5)

In this embodiment, as an example of the light-emitting device of one embodiment of the present invention, a structural example of a lighting device to which the light-emitting element is applied will be described with reference to drawings. Note that description of the same portions as those described in the above embodiments is omitted or simplified.

Figure 12A:
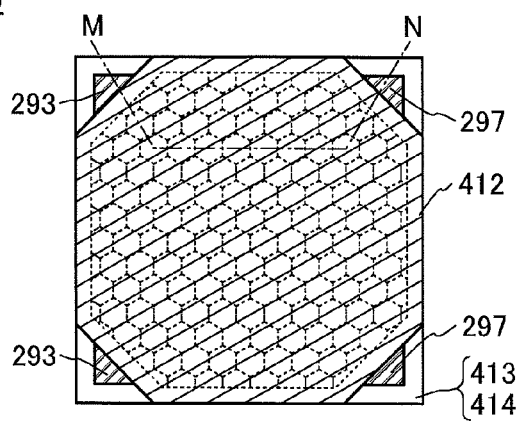
FIGS. 12A and 12B illustrate a lighting device of one embodiment of the present invention.
Figure 12B:
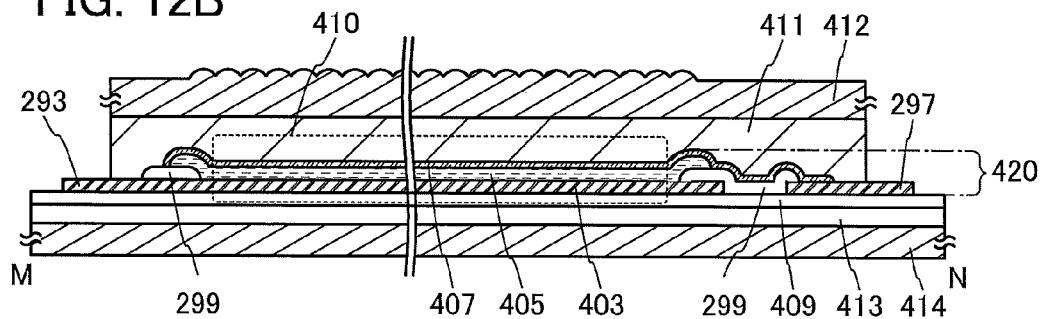

FIG. 12A is a schematic top view of a lighting device 290 described in this embodiment. FIG. 12B is a schematic cross-sectional view taken along a cutting plane line M-N in FIG. 12A. The lighting device 290 has a top emission structure.

In the lighting device 290, the third protection layer 413 is formed over the fourth protection layer 414, and the light-emitting element 410 is formed over the third protection layer 413 with the insulating layer 409 provided therebetween. Furthermore, the first protection layer 411 is provided to cover the light-emitting element 410, and the second protection layer 412 is provided over the first protection layer 411. Over the third protection layer 413, an extraction electrode 293 electrically connected to the first electrode 403 of the light-emitting element 410 and an extraction electrode 297 electrically connected to the second electrode 407 of the light-emitting element 410 are provided in a region overlapping with neither the first protection layer 411 nor the second protection layer 412.

Here, a structure including the light-emitting element 410 corresponds to the element layer 420.

For the first protection layer 411 and the second protection layer 412, a material having a light-transmitting property with respect to light emitted from the EL layer 405 is used.

FIG. 12B illustrates an example in which the extraction electrode 293 and the extraction electrode 297 are formed on the same plane surface and formed from the same layer as the first electrode 403. Here, part of the first electrode 403 forms the extraction electrode 293.

The second electrode 407 is formed to across an insulating layer 299 that covers a step of the first electrode 403 and a step of the extraction electrode 297 to be in contact with the extraction electrode 297, whereby the second electrode 407 is electrically connected to the extraction electrode 297.

Note that the extraction electrodes 293 and 297 may be formed with a conductive film different from the conductive film of the first electrode 403 in different steps. For example, a conductive film having a larger thickness than the first electrode 403 may be placed below the light-emitting element 410 (on the third protection layer 413 side) with an insulating layer provided therebetween. At this time, the conductive film preferably contains copper because the conductivity can be increased. Alternatively, the first electrode 403 may be provided on and in contact with a top surface of the extraction electrode 293 without providing the insulating layer.

The insulating layer 299 is provided to cover an end portion of the first electrode 403 to avoid short circuit between the second electrode 407 and the first electrode 403. Moreover, an upper end portion or a lower end portion of the insulating layer 299 preferably has a curved surface with a radius of curvature of 0.2 μm to 3 μm in order to be adequately covered with the second electrode 407 which is formed over the insulating layer 299. The insulating layer 299 can be formed using an organic compound, such as a negative photosensitive resin or a positive photosensitive resin, or an inorganic compound, such as silicon oxide, or silicon oxynitride.

As illustrated in FIGS. 12A and 12B, lens-shaped projections are preferably formed on the surface of the second protection layer 412, which does not face the light-emitting element 410. The projections are formed for the purpose of suppressing the occurrence of total reflection from the light-emitting element 410 at an interface between the second protection layer 412 and the outside (the air), which results in reduction in light extraction efficiency. For the second protection layer 412, a lens array, a microlens array, a diffusion sheet, a diffusion film, or the like can be used. In particular, with the use of a microlens array, the light extraction efficiency can be efficiently improved and the viewing angle dependence can also be improved; thus, a lighting device with uniform light emission luminance can be achieved.

As a method for forming the projections on the surface of the second protection layer 412, a photolithography method, a nanoimprinting method, a sandblasting method, or the like can be used as appropriate.

Here, the refractive index of the second protection layer 412 is preferably higher than or equal to the refractive index of the first protection layer 411. In other words, the reflective index is preferably set such that a film positioned further from the light-emitting element 410 has a higher refractive index. With such a structure, the occurrence of total reflection at each interface of layers can be suppressed; thus, light emitted from the light-emitting element 410 can be almost thoroughly extracted.

Accordingly, stress applied to the element layer 420 can be reduced and the lighting device 290 itself can have high flexibility because the first protection layer 411 is formed to be sufficiently thin. With the second protection layer 412 which is provided on the outermost surface of the lighting device and has a high hardness at least at the surface that does not face the element layer 420, damage to elements for forming the element layer 420, such as the light-emitting element 410, can be suppressed when the lighting device 290 is bent or mechanical pressure is externally applied to the lighting device 290 even in the case where the first protection layer 411 is formed to be thin, whereby the lighting device 290 can have high flexibility and high mechanical strength.

With the structure where the element layer 420 is sandwiched between a stack of the first protection layer 411 and the second protection layer 412 and a stack of the third protection layer 413 and the fourth protection layer 414, damage to components of the element layer 420 due to pressure from any plane of the lighting device 290 can be suppressed, whereby a highly reliable lighting device whose mechanical strength is improved can be achieved.

This embodiment can be implemented in appropriate combination with any of the other embodiments described in this specification.

(Embodiment 6)

In this embodiment, a light-emitting device of one embodiment of the present invention will be described with reference to FIG. 13 and FIGS. 14A and 14B.

<Structural Example 9 of Light-emitting Device>

Figure 13:
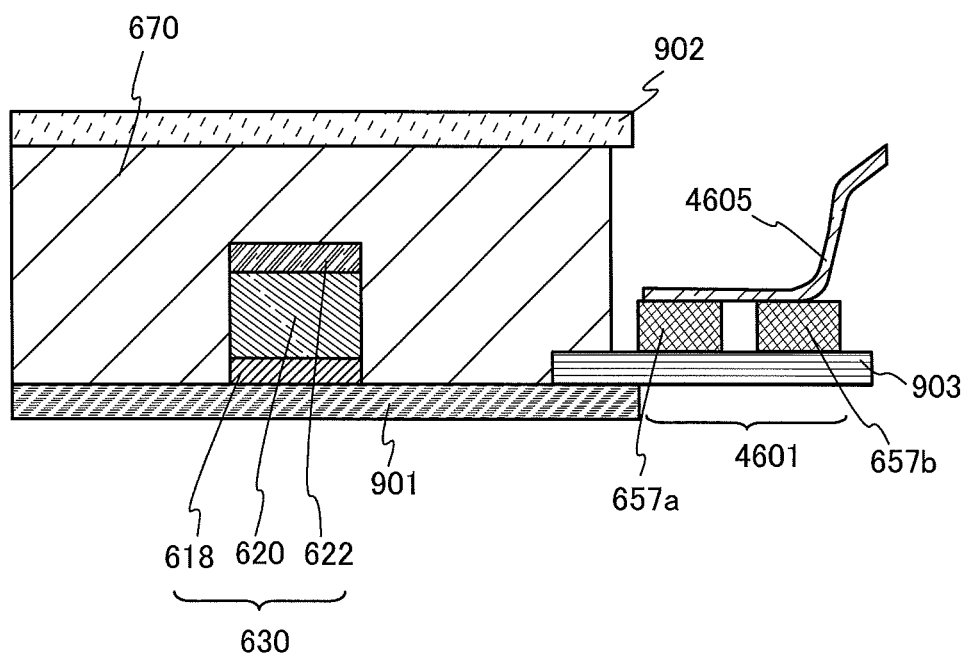
FIG. 13 illustrates a light-emitting device of one embodiment of the present invention.

FIG. 13 is a schematic view of a light-emitting device of one embodiment of the present invention. The light-emitting device illustrated in FIG. 13 includes a first substrate 901, a second substrate 902 which faces the first substrate 901, and a light-emitting element 630 between the first substrate 901 and the second substrate 902. An adhesive layer 670 is provided between the first substrate 901 and the second substrate 902. A terminal portion 4601 includes two or more terminal electrodes over the third substrate 903. Part of the third substrate 903 is sandwiched between the first substrate 901 and the second substrate 902.

The coefficient of thermal expansion of the third substrate 903 is as small as 10 ppm/K. Thus, the third substrate 903 is less likely to be deformed by heat applied to an anisotropic conductive film when an FPC is pressure-bonded to terminal electrodes 657a and 657b. This can prevent a crack in a resin and a wiring which are in contact with the third substrate 903. Consequently, a light-emitting device with few display defects can be obtained.

In FIG. 13, the third substrate 903 does not overlap with the light-emitting element 630. This means that a substrate that does not transmit visible light can be used as the third substrate 903 and the range of material choices is expanded.

A difference in coefficient of thermal expansion between the first substrate 901 and the second substrate 902 is within 10% of each of the coefficient of thermal expansions of the substrates; thus, the substrates are not warped in one direction even in the case where a terminal electrode is heated.

Examples of materials that can be used for the light-emitting device of one embodiment of the present invention will be described. Note that the materials described in the above embodiments are not described here in detail. The materials for the components of the light-emitting device in any of the above embodiments can be applied to the components of the light-emitting device of this embodiment.

[First Substrate, Second Substrate, and Third Substrate]

For the first substrate 901, the second substrate 902, and the third substrate 903, materials similar to the materials for the flexible substrate described in Embodiment 1, the substrate, the second protection layer, and the fourth protection layer described in Embodiment 3 can be used. The second substrate 902 may be a glass substrate, a quartz substrate, a sapphire substrate, a ceramic substrate, a metal substrate, or the like.

In particular, substrates whose coefficient of thermal expansion is 10 ppm/K or lower are used as the first substrate 901 and the third substrate 903. The first substrate 901 and the third substrate 903 are less likely to be deformed by being heated. Thus, even when the first substrate 901 and the third substrate 903 are heated, a crack is less likely to be generated in the first substrate 901 and the third substrate 903 themselves or the resin and the wiring which are in contact with the substrates.

[Terminal Electrode]

The terminal electrodes 657a and 657b can be formed with an electrically conductive substance, such as a metal or a semiconductor.

[Adhesive Layer]

The adhesive layer 670 is in contact with the second electrode 622. The second separation layer 601b and the first substrate 901 are fixed by the adhesive layer 670. The adhesive layer 670 can be fanned with a material similar to that of the adhesive layer 109 described in Embodiment 1. An adhesive with which the second substrate 902 and the layer 505 can be chemically or physically separated when necessary, such as an adhesive that is soluble in water or a solvent or an adhesive which is capable of being plasticized upon irradiation of UV light, is used for the adhesive layer 670.

[Organic EL Element]

The structure of the organic EL element 107 described in Embodiment 1 can be applied to the organic EL element of this embodiment.

<Structural Example 10 of Light-emitting Device>

Figure 14A:
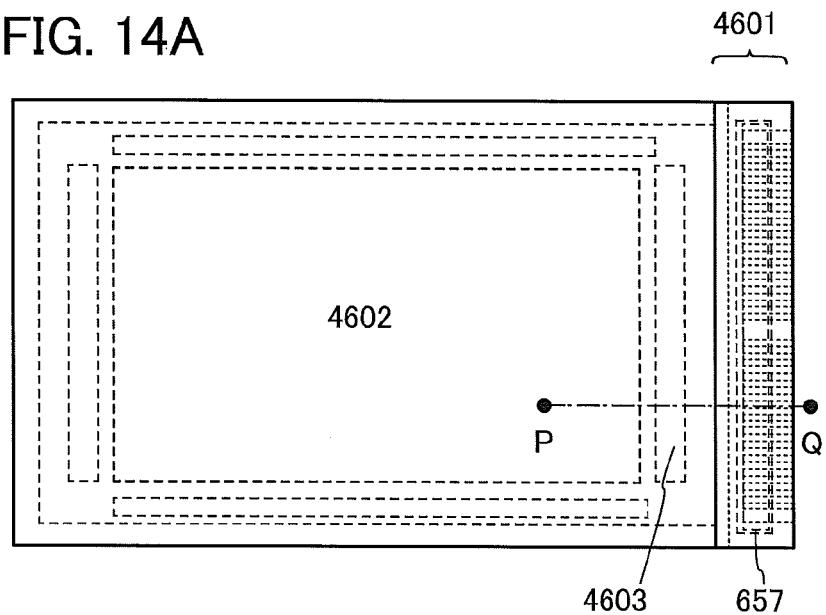
FIGS. 14A and 14B illustrate a light-emitting device of one embodiment of the present invention.

FIG. 14A is a top view of a light-emitting device of one embodiment of the present invention. FIG. 14B is a cross-sectional view taken along a cutting plane line P-Q in FIG. 14A.

Figure 14B:
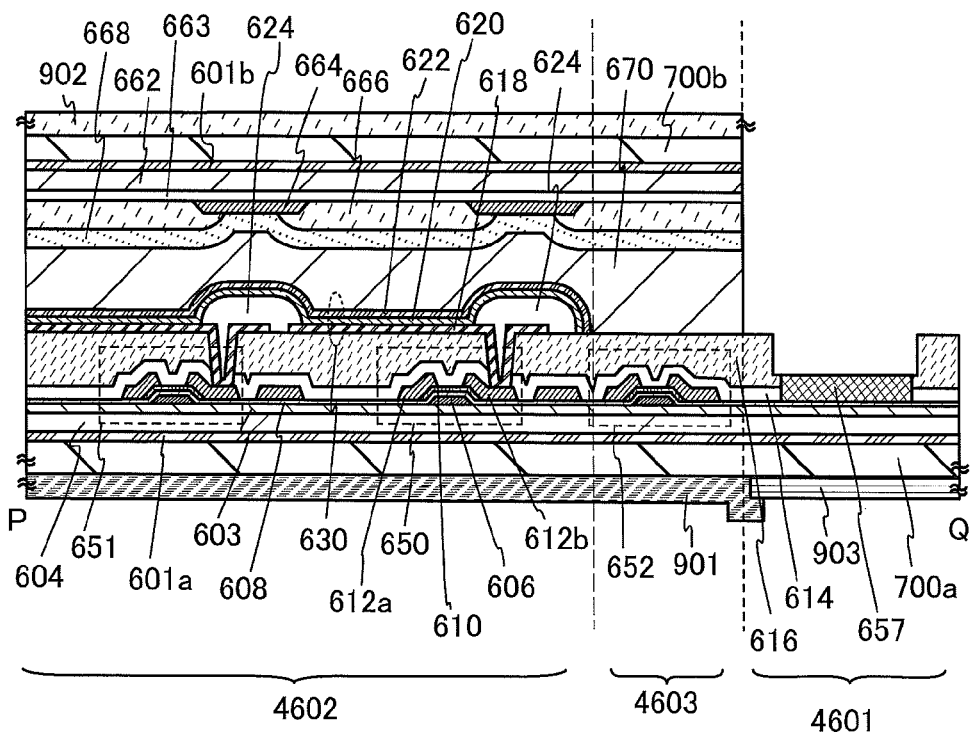

A light-emitting device illustrated in FIG. 14B includes the terminal portion 4601, a pixel portion 4602, and a signal line circuit portion 4603. The terminal portion 4601 includes a terminal electrode 657 over the third substrate 903. In the pixel portion 4602, the light-emitting element 630 and the transistor 650 for controlling the operation of the light-emitting element are sandwiched between the first substrate 901 and the second substrate 902. In the signal line circuit portion 4603, the transistor 652 is sandwiched between the first substrate 901 and the second substrate 902.

The transistor 650 which controls driving of a light-emitting element and the transistor 652 which selects an intended pixel are formed in each pixel.

The transistor 650 includes a gate electrode 606 formed over an insulating layer 603, a gate insulating layer 608 formed over the gate electrode 606, a semiconductor layer 610 formed over the gate insulating layer 608, and a source electrode 612a and a drain electrode 612b formed over the semiconductor layer 610. The transistor 650 is covered with a first insulating layer 614 and a second insulating layer 616. The first electrode 618 is formed over the second insulating layer 616, a layer 620 containing an organic compound (EL layer) is formed over the first electrode layer 618, and the second electrode 622 is formed over the layer 620 containing an organic compound.

The transistor 651 for controlling the operation of the light-emitting element has a structure similar to that of the transistor 650. Note that the size (e.g., channel length and channel width) of each transistor and the connection and the like of the transistors can be adjusted as appropriate.

The light-emitting element 630 is separated by the partition walls 624, whereby pixels are formed.

The partition wall 624 is provided so as to prevent disconnection of the light-emitting element 630 due to steps of the opening and the like provided in the first electrode 618, the first insulating layer 614, and the second insulating layer 616. Thus, it is preferable that the partition wall 624 have a forward tapered shape so that a film formed over the partition wall 624 is prevented from being disconnected. In a forward tapered shape, a layer gradually increases in thickness and is in contact with a layer serving as a base.

The pixel portion 4602 and the signal line circuit portion 4603 include the first substrate 901, a first organic layer 700a, a first buffer layer 604, and the insulating layer 603. The pixel portion 4602 and the signal line circuit portion 4603 may further include a first separation layer 601a.

The second substrate 902 is provided with a second organic layer 700b, a second buffer layer 662, and a passivation layer 663. The second substrate 902 is further provided with a color filter 666 and a light-blocking film 664 which are in contact with the passivation layer 663, and an overcoat 668 which covers the color filter 666 and the light-blocking film 664. Note that the second separation layer 601b may be provided over the second substrate 902 as long as the second separation layer 601b does not block light emitted from the light-emitting element 630.

The coefficient of thermal expansion of the third substrate 903, which overlaps with the terminal portion 4601 of the light-emitting device, is as small as 10 ppm/K. Thus, the third substrate 903 is less likely to be deformed by heat applied to an anisotropic conductive film when an FPC is pressure-bonded to the terminal electrode 657. This can prevent a crack in a resin and a wiring which are in contact with the third substrate 903. Consequently, a light-emitting device with few display defects can be obtained.

In the structure of FIG. 14B, there is no need to provide the third substrate 903 in the pixel portion 4602. This means that a substrate that does not transmit visible light can be used as the third substrate 903.

A difference in coefficient of thermal expansion between the first substrate 901 and the second substrate 902 is within 10% of each of the coefficient of thermal expansions of the substrates; thus, the substrates are not warped in one direction even in the case where the terminal electrode 657 is heated.

A material similar to that for the separation layer described in Embodiment 2 can be used for the first separation layer 601a and the second separation layer 601b. A material similar to that for the adhesive layer described in Embodiment 2 can be used for each of the first organic layer 700a and the second organic layer 700b. A material similar to that for the protection layer described in Embodiment 2 can be used for each of the first buffer layer 604 and the second buffer layer 662.

In addition, materials similar to the base film 121, the gate electrode 131, the gate insulating film 133, the semiconductor layer 135, the conductive layer 137a, and the conductive layer 137b which are described in Embodiment 1 can be used for the insulating layer 603, the gate electrode 606, the gate insulating layer 608, the semiconductor layer 610, the source electrode 612a, and the drain electrode 612b, respectively.

The first insulating layer 614 is formed over the semiconductor layer 610, the source electrode 612a, and the drain electrode 612b. A material similar to that of the insulating film 141 described in Embodiment 1 can be used for the first insulating layer 614.

The second insulating layer 616 is formed over the first insulating layer 614. A material similar to that of the planarization layer 105 described in Embodiment 1 can be used for the second insulating layer 616.

The partition wall 624 is provided to avoid electrical short circuit between adjacent first electrodes 618. In the case where a metal mask is used for forming the layer 620 containing an organic compound, the partition wall 624 also has a function of dividing the layer 620 containing an organic compound between the light-emitting elements. A material similar to that of the partition wall 161 described in Embodiment 1 can be used for the partition wall 624.

Materials similar to those of the base film 185, the black matrix 183, the color filters 157 and 181, the overcoat which are described in Embodiment 2 can be used for the passivation layer 663, the light-blocking film 664, the color filter 666, and the overcoat 668.

<Manufacturing Method 3 of Light-emitting Device>

A method for manufacturing the light-emitting device illustrated in FIGS. 14A and 14B will be described with reference to FIGS. 16A to 16D. Note that the same portions as those described in Embodiment 2 are not described here in detail.

Figure 16A:
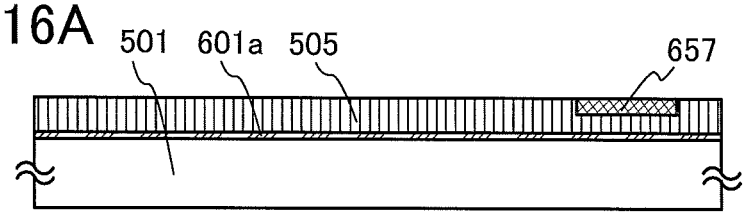
FIGS. 16A to 16D illustrate a method for manufacturing a light-emitting device of one embodiment of the present invention.

First, the first separation layer 601a is formed over the formation substrate 501, and the layer 505 is formed over the first separation layer 601a (FIG. 16A).

There is no particular limitation on a layer formed as the layer 505. Here, a protection layer, the terminal electrode 657, a transistor, the light-emitting element 630, and the like are formed as the layer 505.

Figure 16B:
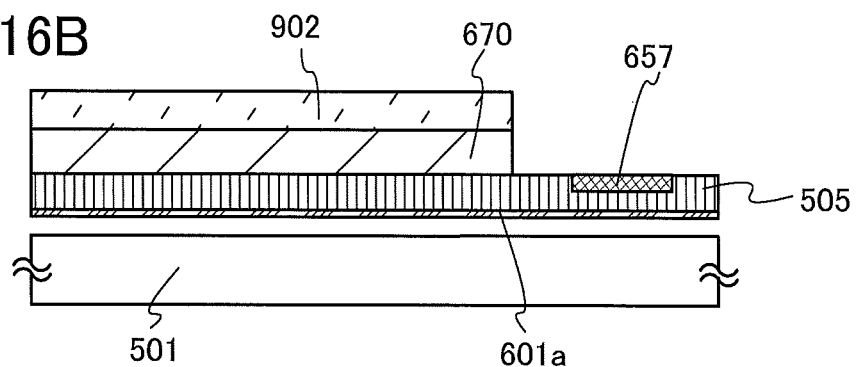

Next, the layer 505 and the second substrate 902 are bonded with the adhesive layer 670, and the layer 505 is separated from the formation substrate 501 along the first separation layer 601a. Accordingly, the layer 505 is placed on the second substrate 902 side (FIG. 16B). Note that necessary components, such as a color filter, are provided in advance over the second substrate 902.

Figure 16C:
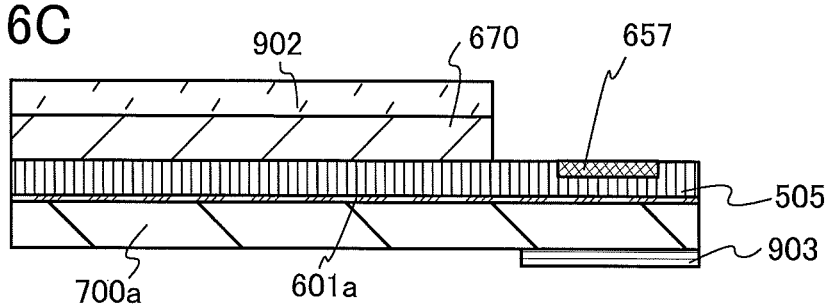

Next, with the use of the first organic layer 700a, the third substrate 903 is bonded to the first separation layer 601a exposed by the separation of the layer 505 from the formation substrate 501 or the layer 505 in which the protection layer is exposed by the separation of the layer 505 from the formation substrate 501 such that the third substrate 903 overlaps with the terminal electrode 657 (FIG. 16C).

Figure 16D:
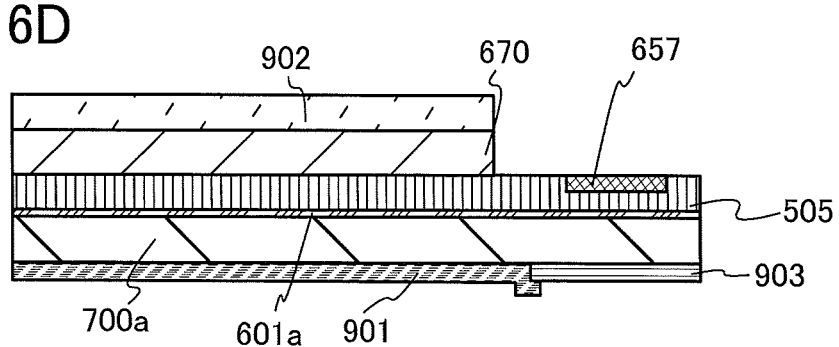

Then, the first substrate 901 is attached to the first organic layer 700a not to overlap with the terminal electrode 657 (FIG. 16D).

Through the above steps, the layer 505 provided with the transistor and the light-emitting element 630 can be formed over the first substrate 901.

Finally, an FPC 4605 is attached to each electrode of the terminal electrode 657 with the use of an anisotropic conductive member. An IC chip or the like may be mounted if necessary.

In the above manner, the light-emitting device illustrated in FIGS. 14A and 14B can be manufactured.

<Structural Example 11 of Light-emitting Device>

In the light-emitting device of one embodiment of the present invention, the structure of the terminal portion 4601 which differs from that in Structural Example 10 will be described with reference to FIG. 15.

Note that the same reference numerals are used for the same parts as those of the light-emitting device described in Embodiment 1, and description of the parts with the same reference numerals will be omitted here.

Figure 15:
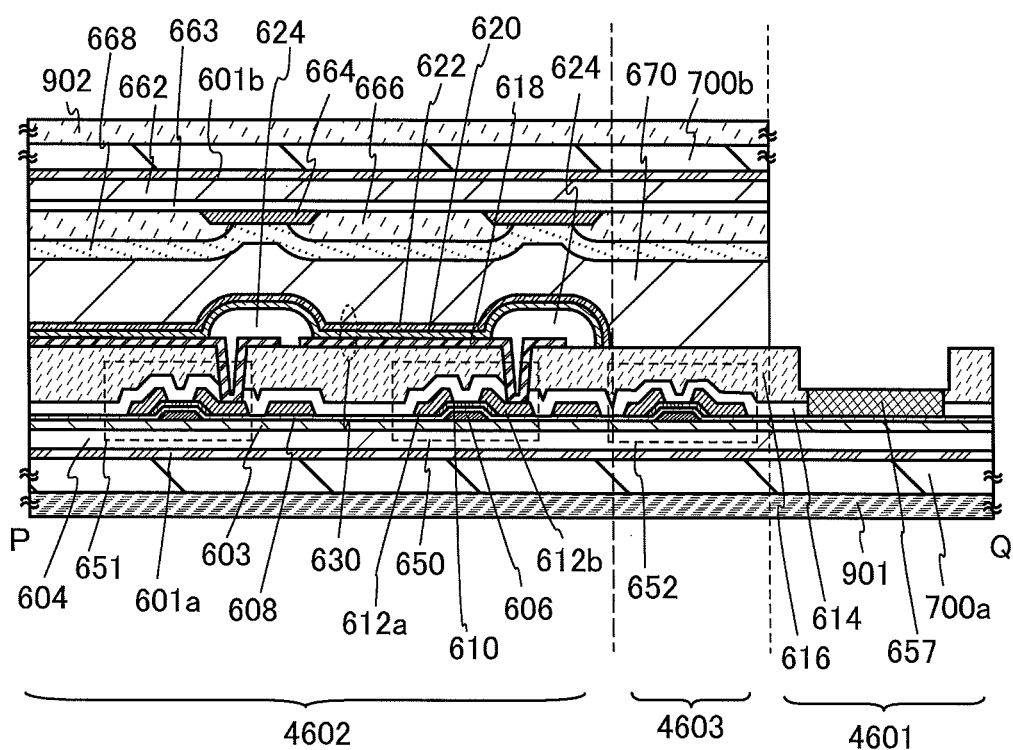
FIG. 15 illustrates a light-emitting device of one embodiment of the present invention.

In a light-emitting device illustrated in FIG. 15, the terminal portion 4601 is provided between the first substrate 901 and the second organic layer 700b.

The terminal electrode 657 overlaps with the first substrate 901 having a small coefficient of thermal expansion. Thus, even when the terminal electrode 657 is heated, the first substrate 901 is less likely to be deformed by heat, so that a crack is less likely to be generated in the resin and the wiring which are in contact with the first substrate 901.

With the above structure, since the first substrate 901 is less likely to be deformed by heat even when the terminal electrode 657 is heated, a crack is less likely to be generated in the first substrate 901 itself or the resin and the wiring which are in contact with the substrate. Consequently, a light-emitting device without display defects can be obtained.

This embodiment can be freely combined with other embodiments.

(Embodiment 7)

In this embodiment, an example of a light-emitting element which can be applied to one embodiment of the present invention will be described with reference to FIGS. 17A to 17F.

Each of the light-emitting elements shown in this embodiment includes a pair of electrodes (a first electrode and a second electrode) and an EL layer(s) provided between the pair of electrodes. One of the electrodes serves as an anode and the other serves as a cathode. The EL layer has at least a light-emitting layer.

Figure 17A:
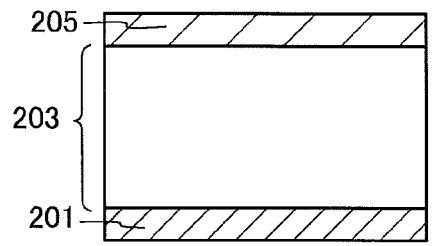
FIGS. 17A to 17F illustrate organic EL elements.

A light-emitting element illustrated in FIG. 17A includes an EL layer 203 between a first electrode 201 and a second electrode 205. In this embodiment, the first electrode 201 serves as the anode, and the second electrode 205 serves as the cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes are recombined in the EL layer 203 and a light-emitting material contained in the EL layer 203 emits light.

The EL layer 203 includes at least a light-emitting layer. In addition to the light-emitting layer, the EL layer 203 may further include one or more layers containing any of a material with a high hole-injection property, a material with a high hole-transport property, a hole-blocking material, a material with a high electron-transport property, a material with a high electron-injection property, a bipolar property (a material with a high electron- and hole-transport property), and the like.

Either a low molecular compound or a high molecular compound can be used for the EL layer 203, and an inorganic compound may also be used.

Figure 17B:
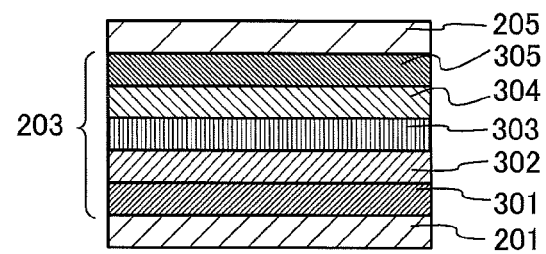

A specific example of a structure of the EL layer 203 is illustrated in FIG. 17B. In the EL layer 203 illustrated in FIG. 17B, a hole-injection layer 301, a hole-transport layer 302, a light-emitting layer 303, an electron-transport layer 304, and an electron-injection layer 305 are stacked in this order from the first electrode 201 side.

Figure 17C:
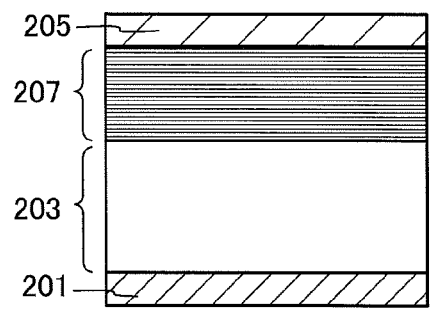

A light-emitting element illustrated in FIG. 17C includes the EL layer 203 between the first electrode 201 and the second electrode 205, and further includes an intermediate layer 207 between the EL layer 203 and the second electrode 205.

Figure 17D:
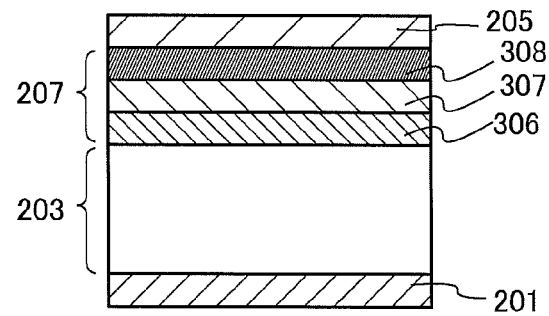

A specific example of a structure of the intermediate layer 207 is illustrated in FIG. 17D. The intermediate layer 207 includes at least a charge-generation region 308. In addition to the charge-generation region 308, the intermediate layer 207 may further include an electron-relay layer 307 and an electron-injection buffer layer 306.

When a voltage higher than the threshold voltage of the light-emitting element is applied between the first electrode 201 and the second electrode 205, holes and electrons are generated in the charge-generation region 308, and the holes move into the second electrode 205 and the electrons move into the electron-relay layer 307. The electron-relay layer 307 has a high electron-transport property and immediately transfers the electrons generated in the charge-generation region 308 to the electron-injection buffer layer 306. The electron-injection buffer layer 306 reduces a barrier to electron injection into the EL layer 203, so that the efficiency of the electron injection into the EL layer 203 is increased. Thus, the electrons generated in the charge-generation region 308 are injected into the LUMO level of the EL layer 203 through the electron-relay layer 307 and the electron-injection buffer layer 306.

In addition, the electron-relay layer 307 can prevent reaction at the interface between a material contained in the charge-generation region 308 and a material contained in the electron-injection buffer layer 306. Thus, it is possible to prevent interaction such as damaging the functions of the charge-generation region 308 and the electron-injection buffer layer 306.

Figure 17E:
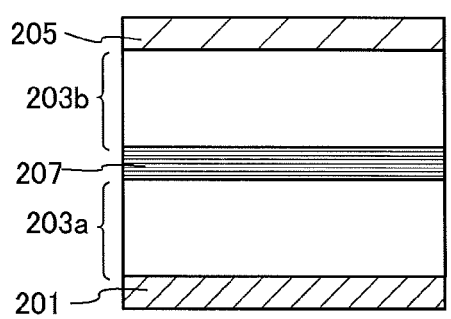
Figure 17F:
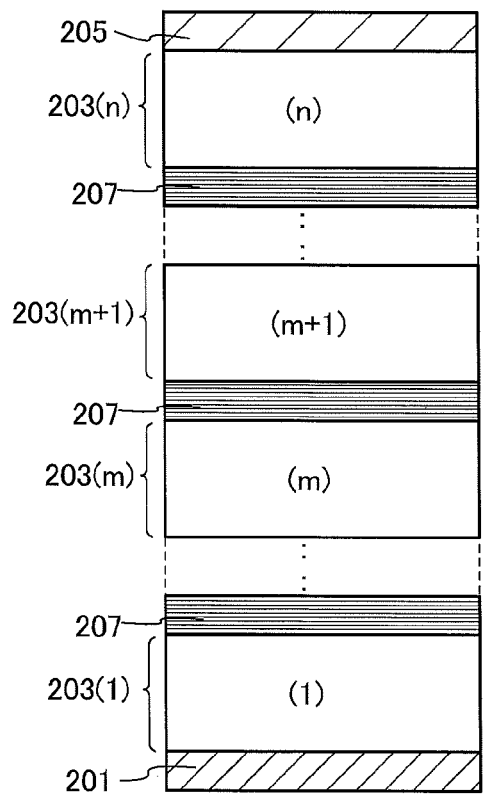

As illustrated in light-emitting elements in FIGS. 17E and 17F, a plurality of EL layers may be stacked between the first electrode 201 and the second electrode 205. In this case, the intermediate layer 207 is preferably provided between the stacked EL layers. For example, the light-emitting element illustrated in FIG. 17E includes the intermediate layer 207 between a first EL layer 203a and a second EL layer 203b. The light-emitting element illustrated in FIG. 17F includes n EL layers (n is a natural number of 2 or more), and the intermediate layers 207 between the EL layers.

The following will show behaviors of electrons and holes in the intermediate layer 207 between the EL layer 203($m$) and the EL layer 203($m$+1). When a voltage higher than the threshold voltage of the light-emitting element is applied between the first electrode 201 and the second electrode 205, holes and electrons are generated in the intermediate layer 207, and the holes move into the EL layer 203($m$+1) provided on the second electrode 205 side and the electrons move into the EL layer 203($m$) provided on the first electrode 201 side.

The holes injected into the EL layer 203($m$+1) are recombined with the electrons injected from the second electrode 205 side, so that a light-emitting material contained in the EL layer 203($m$+1) emits light. Further, the electrons injected into the EL layer 203($m$) are recombined with the holes injected from the first electrode 201 side, so that a light-emitting material contained in the EL layer 203($m$) emits light. Thus, the holes and electrons generated in the intermediate layer 207 cause light emission in the respective EL layers.

Note that the EL layers can be provided in contact with each other as long as the same structure as the intermediate layer is formed therebetween. For example, when the charge-generation region is formed over one surface of an EL layer, another EL layer can be provided in contact with the surface.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. That is, white light emission can be obtained by mixture of light from materials whose emission colors are complementary colors. This can be applied to a light-emitting element having three or more EL layers.

FIGS. 17A to 17F can be used in an appropriate combination. For example, the intermediate layer 207 can be provided between the second electrode 205 and the EL layer 203($n$) in FIG. 17F.

Examples of materials which can be used for each layer will be described below. Note that each layer is not limited to a single layer, but may be a stack of two or more layers.

<Anode>

The electrode serving as the anode (the first electrode 201) can be formed using one or more kinds of conductive metals, alloys, conductive compounds, and the like. In particular, it is preferable to use a material with a high work function (4.0 eV or more). Examples include ITO, indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal material (e.g., titanium nitride).

When the anode is in contact with the charge-generation region, any of a variety of conductive materials can be used regardless of their work functions; for example, aluminum, silver, an alloy containing aluminum, or the like can be used.

<Cathode>

The electrode serving as the cathode (the second electrode 205) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that in the case where the cathode is in contact with the charge-generation region, a variety of conductive materials can be used regardless of its work function. For example, ITO, silicon, or indium tin oxide containing silicon oxide can be used.

The light-emitting element may have a structure in which one of the anode and the cathode is formed using a conductive film that transmits visible light and the other is formed using a conductive film that reflects visible light, or a structure in which both the anode and the cathode are formed using conductive films that transmit visible light.

The conductive film that transmits visible light can be formed using, for example, indium oxide, ITO, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film include titanium and titanium oxide. Alternatively, the conductive film having a property of property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

Note that in the case where a conductive oxide film is formed as the above conductive film having a property of transmitting visible light by a sputtering method, the use of a deposition atmosphere containing argon and oxygen allows the light-transmitting property to be increased.

Furthermore, in the case where the conductive oxide film is formed over the EL layer, it is preferable to stack a first conductive oxide film formed under an atmosphere containing argon with a reduced oxygen concentration and a second conductive oxide film formed under an atmosphere containing argon and oxygen because damage to the EL layer caused by the film formation can be reduced. Here, the purity of an argon gas used for formation of the first conductive oxide film is preferably high, and for example, it is preferable to use the argon gas whose dew point is lower than or equal to −70° C., more preferably lower than or equal to −100° C.

<Hole-injection Layer 301>

The hole-injection layer 301 contains a material with a high hole-injection property.

Examples of the substance having a high hole-injection property include metal oxides such as molybdenum oxide, vanadium oxide, ruthenium oxide, tungsten oxide, and manganese oxide; and phthalocyanine-based compounds such as phthalocyanine (abbreviation: $H_2Pc$) and copper(II) phthalocyanine (abbreviation: CuPc).

Other examples of the substance having a high hole-injection property include high molecular compounds such as poly(N-vinylcarbazole) (abbreviation: PVK), poly(4-vinyltriphenylamine) (abbreviation: PVTPA); and high molecular compounds to which acid such as poly(3,4-ethylenedioxythiophene)/poly(styrenesulfonic acid) (PEDOT/PSS) is added.

The hole-injection layer 301 may serve as the charge-generation region. When the hole-injection layer 301 in contact with the anode serves as the charge-generation region, a variety of conductive materials can be used for the anode regardless of their work functions. Materials contained in the charge-generation region will be described later.

<Hole-transport Layer 302>

The hole-transport layer 302 contains a material with a high hole-transport property.

The substance having a high hole-transport property is a substance whose hole-transport property is higher than its electron-transport property; particularly, it is preferable that the hole mobility of the substance having a high hole-transport property be greater than or equal to $10^{-6}$ $cm^2/Vs$. A variety of compounds can be used. For example, an aromatic amine compound such as 4,4'-bis[N-(1-naphthyl)-N-phenylamino]biphenyl (abbreviation: NPB or α-NPD) or 4-phenyl-4'-(9-phenylfluoren-9-yl)triphenylamine (abbreviation: BPAFLP); a carbazole derivative such as 4,4'-di(N-carbazolyl)biphenyl (abbreviation: CBP), 9-[4-(10-phenyl-9-anthracenyl)phenyl]-9H-Carbazole (abbreviation: CzPA), or 9-phenyl-3-[4-(10-phenyl-9-anthryl)phenyl]-9H-carbazole (abbreviation: PCzPA); aromatic hydrocarbon compound such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth); a high molecular compound such as PVK or PVTPA.

<Light-emitting Layer 303>

For the light-emitting layer 303, a fluorescent compound which exhibits fluorescence or a phosphorescent compound which exhibits phosphorescence can be used.

Examples of the fluorescent compound that can be used for the light-emitting layer 303 include N,N'-bis[4-(9H-carbazol-9-yl)phenyl]-N,N'-diphenylstilbene-4,4'-diamine (abbreviation: YGA2S), N-(9,10-diphenyl-2-anthryl)-N,9-diphenyl-9H-carbazol-3-amine (abbreviation: 2PCAPA), and rubrene.

Examples of the phosphorescent compound that can be used for the light-emitting layer 303 include organometallic complexes such as bis[2-(4',6'-difluorophenyl)pyridinato-N, $C^{2'}$]iridium(III) picolinate (abbreviation: FIrpic), tris(2-phenylpyridinato-N,$C^{2'}$)iridium(III) (abbreviation: $Ir(ppy)_3$), and (acetylacetonato)bis(3,5-dimethyl-2-phenylpyrazinato) iridium(III) (abbreviation: $Ir(mppr-Me)_2(acac)$).

The light-emitting layer 303 may have a structure in which any of the above-described light-emitting organic compounds (a light-emitting substance or a guest material) is dispersed in another substance (a host material). As the host material, a variety of kinds of materials can be used, and it is preferable to use a substance which has a lowest unoccupied molecular orbital level (LUMO level) higher than that of the guest material and has a highest occupied molecular orbital level (HOMO level) lower than that of the guest material.

With the structure in which the guest material is dispersed in the host material, crystallization of the light-emitting layer 303 can be suppressed. Furthermore, concentration quenching due to high concentration of the guest material can be suppressed.

As the host material, the above-described substance having a high hole-transport property (e.g., an aromatic amine compound or a carbazole derivative) or a later-described substance having a high electron-transport property (e.g., a metal complex having a quinoline skeleton or a benzoquinoline skeleton or a metal complex having an oxazole-based or thiazole-based ligand) can be used. As the host material, specifically, a metal complex such as tris(8-quinolinolato)aluminum(III) (abbreviation: Alq) or bis(2-methyl-8-quinolinolato)(4-phenylphenolato)aluminum(III) (abbreviation: BAlq); a heterocyclic compound such as 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP); a condensed aromatic compound such as CzPA, DNA, t-BuDNA, or DPAnth; or an aromatic amine compound such as NPB can be used.

Alternatively, as the host material, plural kinds of materials can be used. For example, in order to suppress crystallization, a substance such as rubrene that suppresses crystallization, may be further added. In addition, NPB, Alq, or the like may be further added in order to transfer energy to the guest material more efficiently.

Further, when a plurality of light-emitting layers are provided and emission colors of the layers are made different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. Further, the same applies to a light-emitting element having three or more light-emitting layers.

<Electron-transport Layer 304>

The electron-transport layer 304 contains a material with a high electron-transport property.

The material with a high electron-transport property is preferably an organic compound having a property of transporting more electrons than holes, and is especially preferably a material with an electron mobility of $10^{-6}$ cm$^2$/V·s or more.

As the substance having a high electron-transport property, for example, a metal complex having a quinoline skeleton or a benzoquinoline skeleton, such as Alq or Balq, can be used. Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) or the like can be used. Alternatively, TAZ, BPhen, BCP, or the like can be used.

<Electron-injection Layer 305>

The electron-injection layer 305 contains a material with a high electron-injection property.

Examples of the substance having a high electron-injection property include alkali metals, alkaline earth metals, and compounds thereof, such as lithium, cesium, calcium, lithium fluoride, cesium fluoride, calcium fluoride, and lithium oxide. In addition, a rare earth metal compound such as erbium fluoride can also be used. Furthermore, the substance for the electron-transport layer 304 described above can also be used.

<Charge-generation Region>

The charge-generation region included in the hole-injection layer and the charge-generation region 308 each contains a material with a high hole-transport property and an acceptor material (electron acceptor). Note that the acceptor material is preferably added so that the mass ratio of the acceptor material to the material with a high hole-transport property is 0.1:1 to 4.0:1.

The charge-generation region is not limited to a structure in which a material with a high hole-transport property and an acceptor material are contained in the same film, and may have a structure in which a layer containing a material with a high hole-transport property and a layer containing an acceptor material are stacked. Note that in the case of a stacked-layer structure in which the charge-generation region is provided on the cathode side, the layer containing the material with a high hole-transport property is in contact with the cathode, and in the case of a stacked-layer structure in which the charge-generation region is provided on the anode side, the layer containing the acceptor material is in contact with the anode.

The material with a high hole-transport property is preferably an organic compound having a property of transporting more holes than electrons, and is especially preferably an organic compound with a hole mobility of $10^{-6}$ cm$^2$/V·s or more.

Specifically, it is possible to use any of the materials with a high hole-transport property shown as materials that can be used for the hole-transport layer 302, such as aromatic amine compounds such as NPB and BPAFLP, carbazole derivatives such as CBP, CzPA, and PCzPA, aromatic hydrocarbon compounds such as t-BuDNA, DNA, and DPAnth, and high molecular compounds such as PVK and PVTPA.

Examples of the acceptor material include organic compounds, such as 7,7,8,8-tetracyano-2,3,5,6-tetrafluoroquinodimethane (abbreviation: F$_4$-TCNQ) and chloranil, oxides of transition metals, and oxides of metals that belong to Groups 4 to 8 in the periodic table. Specifically, vanadium oxide, niobium oxide, tantalum oxide, chromium oxide, molybdenum oxide, tungsten oxide, manganese oxide, and rhenium oxide are preferable since their electron-accepting property is high. In particular, use of molybdenum oxide is preferable because of its stability in the atmosphere, a low hygroscopic property, and easily handling.

<Electron-injection Buffer Layer 306>

The electron-injection buffer layer 306 contains a material with a high electron-injection property. The electron-injection buffer layer 306 facilitates electron injection from the charge-generation region 308 into the EL layer 203. As the material having a high electron-injection property, any of the above-described materials can be used. Alternatively, the electron-injection buffer layer 306 may contain any of the above-described materials with a high electron-transport property and donor materials.

<Electron-relay Layer 307>

The electron-relay layer 307 immediately accepts electrons drawn out of the acceptor material in the charge-generation region 308.

The electron-relay layer 307 contains a material with a high electron-transport property. As the material with a high electron-transport property, a phthalocyanine-based material or a metal complex having a metal-oxygen bond and an aromatic ligand is preferably used.

As the phthalocyanine-based material, specifically, it is possible to use CuPc, vanadyl 2,9,16,23-tetraphenoxy-29H, 31H-phthalocyanine (PhO-VOPc), or the like.

As the metal complex having a metal-oxygen bond and an aromatic ligand, a metal complex having a metal-oxygen double bond is preferably used. A metal-oxygen double bond has an acceptor property; thus, electrons can transfer (be donated and accepted) more easily.

As the metal complex having a metal-oxygen bond and an aromatic ligand, a phthalocyanine-based material is also preferably used.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron-relay layer 307 may further contain any of the above-described donor materials. When the donor material is contained in the electron-relay layer 307, electrons can transfer easily and the light-emitting element can be driven at a lower voltage.

The LUMO levels of the material with a high electron-transport property and the donor material are preferably −5.0 eV to −3.0 eV, i.e., between the LUMO level of the acceptor material contained in the charge-generation region 308 and the LUMO level of the material with a high electron-transport property contained in the electron-transport layer 304 (or the LUMO level of the EL layer 203 in contact with the electron-relay layer 307 or the electron-injection buffer layer 306). When a donor material is contained in the electron-relay layer 307, as the material with a high electron-transport property, a material with a LUMO level higher than the acceptor level of the acceptor material contained in the charge-generation region 308 can be used.

The above-described layers included in the EL layer 203 and the intermediate layer 207 can be formed separately by any of the following methods: an evaporation method (including a vacuum evaporation method); a transfer method; a printing method; a discharging method such as an ink-jet method or a dispensing method; a coating method such as a spin-coating method; and the like.

This embodiment can be freely combined with other embodiments.

(Embodiment 8)

In this embodiment, an oxide semiconductor which can be used for the semiconductor layer of a transistor included in a light-emitting device of one embodiment of the present invention will be described.

At least indium (In) or zinc (Zn) is preferably contained as an oxide semiconductor used for the semiconductor layer of the transistor. In particular, In and Zn are preferably contained. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, the following can be used, for example: an In—Sn—Ga—Zn-based oxide, an In—Ga—Zn-based oxide, an In—Sn—Zn-based oxide, an In—Zr—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, an In-based oxide, a Sn-based oxide, or a Zn-based oxide.

Note that here, for example, an "In—Ga—Zn-based oxide" refers to an oxide mainly containing In, Ga, and Zn, and there is no limitation on the ratio of In to Ga and Zn.

Alternatively, a material represented by $InMO_3(ZnO)_m$ (m>0) may be used as the oxide semiconductor. Note that M represents one or more metal elements selected from Ga, Fe, Mn, or Co. Still alternatively, a material represented by $In_2SnO_5(ZnO)_n$ (n>0 is satisfied, and n is an integer) may be used as an oxide semiconductor.

For example, an In—Ga—Zn-based oxide with an atomic ratio of In:Ga:Zn=3:1:2, 1:1:1, or 2:2:1, or an oxide whose atomic ratio is in the neighborhood of the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy a formula $(a-A)^2+(b-B)^2+(c-C)^2 \le r^2$. In the formula, r may be, for example, 0.05. The same applies to other oxides.

However, the composition of the oxide semiconductor is not limited to those described above, and an oxide semiconductor having an appropriate composition may be used depending on necessary semiconductor characteristics (e.g., field-effect mobility or threshold voltage). In order to obtain the required semiconductor characteristics, it is preferable that the carrier concentration, the impurity concentration, the defect density, the atomic ratio between a metal element and oxygen, the interatomic distance, the density, and the like be set to appropriate values.

When an oxide semiconductor is highly purified, the off-state current of a transistor using such an oxide semiconductor in a semiconductor layer can be sufficiently reduced (here, the off-state current means a drain current when a potential difference between a source and a gate is equal to or lower than the threshold voltage in the off state, for example). A highly purified oxide semiconductor can be obtained, for example, in such a manner that a film is deposited while heating is performed so as to prevent hydrogen and a hydroxyl group from being contained in the oxide semiconductor, or heat treatment is performed after film deposition so as to remove hydrogen and a hydroxyl group from the film When an In—Ga—Zn-based oxide which is used for a channel region of a transistor is highly purified, the off-state current per channel width can be approximately from $1 \times 10^{-24}$ A/μm (1 yA/μm) to $1 \times 10^{-22}$ A/μm (100 yA/μm).

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, change in electric characteristics of the transistor due to irradiation with visible light or ultraviolet light is small. Thus, the transistor has high reliability.

This embodiment can be freely combined with other embodiments.

(Embodiment 9)

In this embodiment, an electronic device and a lighting device to which a light-emitting device of one embodiment of the present invention is applied will be described with reference to FIGS. 18A to 18E.

A light-emitting device of one embodiment of the present invention is a highly reliable light-emitting device having flexibility in which damage to a transistor and/or an organic EL element due to bending or curving when physical power is externally applied can be suppressed. Accordingly, with the use of such a light-emitting device, a highly reliable electronic device that has high resistance to bending, curving, and the like can be achieved.

As examples of the electronic devices, the following can be given: television devices (also referred to as televisions or television receivers), monitors of computers or the like, cameras such as digital cameras or digital video cameras, digital photo frames, mobile phones (also referred to as cellular phones or cellular phone devices), portable game machines, portable information terminals, audio reproducing devices, large game machines such as pachinko machines, and the like.

The light-emitting device of one embodiment of the present invention can be incorporated along a curved inside/outside wall surface of a house or a building or a curved interior/exterior surface of a car.

Figure 18A:
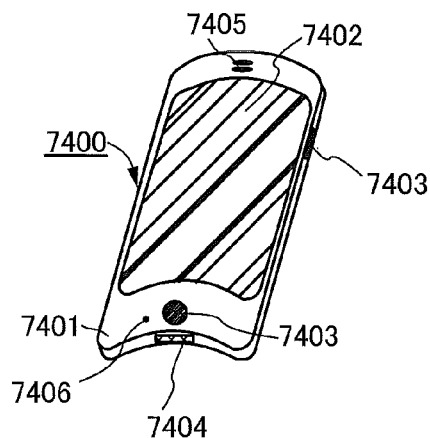
FIGS. 18A to 18E illustrate electronic devices and lighting devices.

FIG. 18A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 18A is touched with a finger or the like, data can be input into the mobile phone 7400. Further, operations such as making a call and inputting a letter can be performed by touch on the display portion 7402 with a finger or the like.

With the operation buttons 7403, power ON or OFF can be switched. In addition, a variety of images displayed on the display portion 7402 can be switched; switching a mail creation screen to a main menu screen, for example.

The display portion 7402 includes a light-emitting device of one embodiment of the present invention; thus, a reliable mobile phone having a curved display portion can be provided.

Figure 18B:
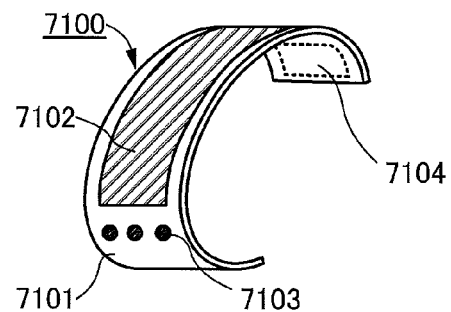

FIG. 18B is an example of a wristband-type portable display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

The display portion 7102 includes a light-emitting device of one embodiment of the present invention; thus, a reliable portable display device having a curved display portion can be provided.

Figure 18C:
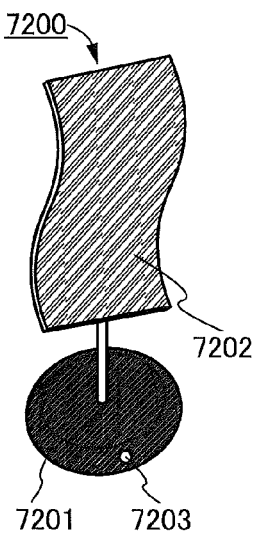
Figure 18D:
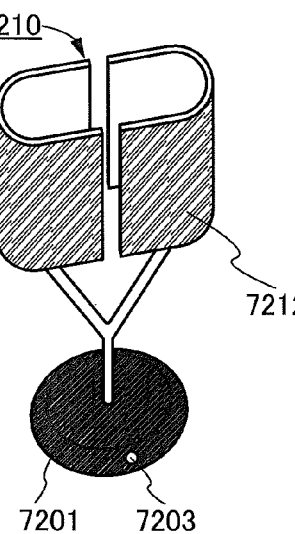
Figure 18E:
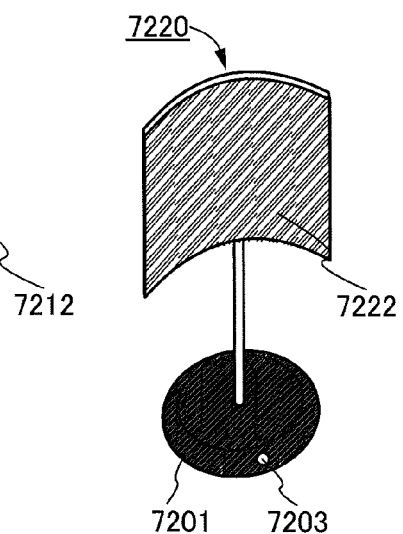

FIGS. 18C to 18E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 18C includes a light-emitting portion 7202 having a wave-shaped light-emitting surface, which is good-design lighting device.

A light-emitting portion 7212 included in the lighting device 7210 illustrated in FIG. 18D has two convex-curved light-emitting portions symmetrically placed. Thus, all directions can be illuminated with the lighting device 7210 as a center.

The lighting device 7220 illustrated in FIG. 18E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Each light-emitting portion includes a light-emitting device of one embodiment of the present invention; thus, a reliable lighting device having a curved light-emitting portion can be provided.

Figure 19A:
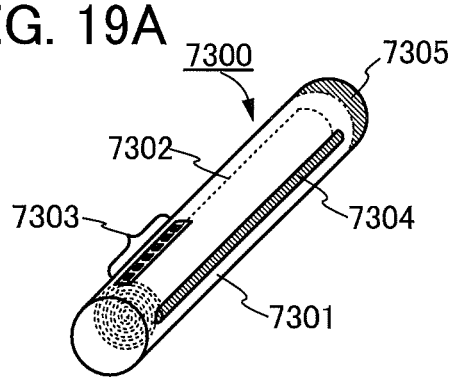
FIGS. 19A and 19B illustrate electronic devices.

FIG. 19A illustrates an example of a portable display device. A display device 7300 includes a housing 7301, a display portion 7302, operation buttons 7303, a display portion pull 7304, and a control portion 7305.

The display device 7300 includes a rolled flexible display portion 7102 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, power ON/OFF, switching of displayed videos, and the like can be performed.

Figure 19B:
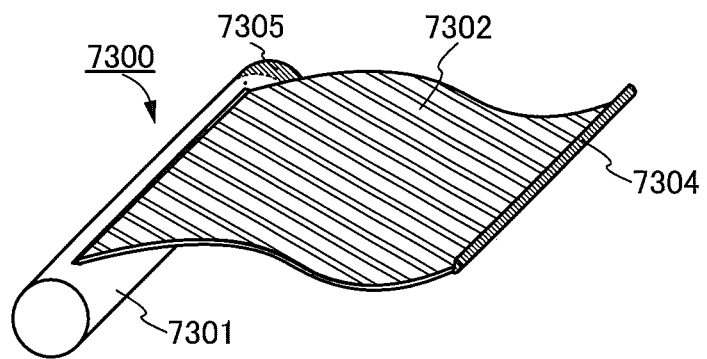

FIG. 19B illustrates a display device 7300 in a state where the display portion 7302 is pulled out with the display portion pull 7304. Videos can be displayed on the display portion 7302 in this state. Further, the operation buttons 7303 on the surface of the housing 7301 allow one-handed operation. The operation button 7303 is provided not in the center of the housing 7301 but on one side of the housing 7301 as illustrated in FIG. 19A, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the light-emitting device of one embodiment of the present invention. Thus, the display portion 7302 is a display device which is flexible and highly reliable, which makes the display device 7300 light-weight and highly reliable.

Needless to say, there is no particular limitation to the above-described electronic device or the above-described lighting device as long as the light-emitting device of one embodiment of the present invention is included.

This embodiment can be freely combined with other embodiments.

EXAMPLE

A light-emitting device of one embodiment of the present invention was manufactured, and the characteristics of a transistor included in the light-emitting device were evaluated. In this example, the results of the evaluation will be described.

In this example, Sample a that is a light-emitting device of one embodiment of the present invention and Comparative sample b that is a light-emitting device of a comparative example were manufactured. Sample a includes, between the first flexible substrate 101 and the second flexible substrate 111, the planarization layer 105, the transistor 103 provided on the one surface side of the planarization layer 105, the organic EL element 107 provided on the other surface side of the planarization layer 105, and the adhesive layer 109 for bonding the pair of substrates (see FIG. 1). Comparative sample b includes a planarization layer, a transistor, and an organic EL element, which are similar to those in Sample a, in a space surrounded by a pair of glass substrates (without flexibility) and an adhesive layer. The space was in an inert atmosphere.

First, a process for manufacturing Sample a will be described. In this example, the steps are described with reference to FIGS. 6A to 6E.

First, a 200-nm-thick silicon oxynitride film was formed as a base film over a glass substrate serving as the formation substrate 501. Then, washing was performed using a hydrogen fluoride aqueous solution of 0.5%. This step leads to improvement in adhesion between the base film and the separation layer 503 to be formed later.

Next, a 30-nm-thick tungsten film was formed over the base film as the separation layer 503, and the layer 505 was formed over the separation layer 503 (FIG. 6A). In this example, the layer 505 includes an insulating film, the transistor 103, the planarization layer 105, the organic EL element 107, and the like.

As the layer 505, first, an insulating film was formed over the separation layer 503. For the insulating film, a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film were stacked in this order. After that, heat treatment was performed at 480° C. in a nitrogen atmosphere for one hour. Then, washing was performed using a hydrogen fluoride aqueous solution of 0.5%.

Next, the transistor 103 was formed over the insulating film. A 200-nm-thick tungsten film was formed by a sputtering method over the insulating film. A mask was formed over the tungsten film by a photolithography process, and part of the tungsten film was etched with the use of the mask, so that the gate electrode was formed.

Next, a gate insulating film was formed over the gate electrode. For the gate insulating film, a 90-nm-thick silicon nitride film and a 50-nm-thick silicon oxynitride film were stacked in this order.

Next, an oxide semiconductor film was formed to overlap with the gate electrode with the gate insulating film provided therebetween. Here, a 35-nm-thick oxide semiconductor film was formed over the gate insulating film by a sputtering method, a mask was formed over the oxide semiconductor film by a photolithography process, and part of the oxide semiconductor film was etched with the use of the mask, whereby the oxide semiconductor film was formed.

The oxide semiconductor film was formed in such a manner that a sputtering target where In:Ga:Zn=1:1:1 (atomic ratio) was used, argon with a flow rate of 50 sccm and oxygen with a flow rate of 50 sccm were supplied as a sputtering gas into a reaction chamber of a sputtering apparatus, the pressure in the reaction chamber was adjusted to 0.7 Pa, and a direct-current power of 5 kW was supplied. Note that the oxide semiconductor film was formed at a substrate temperature of 170° C.

After that, heat treatment at 450° C. in a nitrogen atmosphere for one hour and then heat treatment at 450° C. in an oxygen atmosphere for one hour were performed.

Next, part of the gate insulating film was etched to expose the gate electrode, and then a pair of electrodes (a source electrode and a drain electrode) in contact with the oxide semiconductor film was formed. Here, a conductive film was formed over the gate insulating film and the oxide semiconductor film. For the conductive film, a 50-nm-thick tungsten film, a 400-nm-thick aluminum film, and a 100-nm-thick titanium film were stacked in this order. Then, a mask was formed over the conductive film by a photolithography process, and part of the conductive film was etched with the use of the mask, whereby the pair of electrodes was formed.

Then, the oxide semiconductor film was exposed to oxygen plasma which was generated in such a manner that an upper electrode provided in the reaction chamber was supplied with high-frequency power of 150 W with the use of a 27.12 MHz high-frequency power source.

Next, a protection film was formed over the oxide semiconductor film and the pair of electrodes. Here, for the protection film, a first oxide insulating film, a second oxide insulating film, and a nitride insulating film were formed.

First, a 50-nm-thick silicon oxynitride film was formed as the first oxide insulating film and a 400-nm-thick silicon oxynitride film was formed as the second oxide insulating film.

Next, heat treatment was performed to remove water, nitrogen, hydrogen, and the like from the first oxide insulating film and the second oxide insulating film. Here, the heat treatment was performed in an atmosphere of nitrogen and oxygen at 350° C. for one hour.

Next, the substrate was transferred to a treatment chamber under reduced pressure and heated at 350° C., and a nitride insulating film was formed over the second oxide insulating film. Here, as the nitride insulating film, a 100-nm-thick silicon nitride film was formed.

Then, part of the protection film was etched to form an opening from which part of the pair of electrodes was exposed.

The planarization layer 105 was formed over the protection film. Here, the protective film was coated with a composition, and exposure and development were performed, so that the planarization film 150 having an opening through which the pair of electrodes is partly exposed was formed. Note that as the planarization layer 105, a 1.5-μm-thick acrylic resin layer was formed. After that, heat treatment was performed. The heat treatment was performed in a nitrogen atmosphere at 250° C. for one hour.

Next, a conductive film electrically connected to part of the pair of electrodes was formed. Here, for the lower electrode of the organic EL element 107, a 50-nm-thick titanium film, a 200-nm-thick aluminum film, and a 3-nm-thick titanium film were formed by a sputtering method, and furthermore, an indium tin oxide containing silicon oxide (ITSO) film was formed as an optical adjustment layer. The thickness of the ITSO films of light-emitting elements in a red pixel, a green pixel, and a blue pixel were 82 nm, 45 nm, and 5 nm, respectively.

Then, a partition wall was formed to cover an end portion of the conductive film. Here, a 1.0-μm-thick polyimide resin film was formed as the partition wall. After that, heat treatment was performed. The heat treatment was performed in an atmosphere containing nitrogen at 250° C. for one hour.

A spacer with an inverse tapered shape was formed on the partition wall. Here, a 2.0-μm-thick spacer was formed with the use of a negative photosensitive resin. After that, heat treatment was performed. The heat treatment was performed in an atmosphere containing nitrogen at 250° C. for one hour.

Next, an EL layer and an upper electrode were formed over the conductive film All the light-emitting elements in different color pixels have the same structures of the EL layer and the upper electrode. The light-emitting element of this example is a tandem light-emitting element in which the EL layer includes a fluorescence-emitting unit including a blue light-emitting layer and a phosphorescence-emitting unit including a green light-emitting layer and a red light-emitting layer. As the upper electrode, a 15-nm-thick film was formed by co-evaporation of magnesium and silver. Furthermore, a 70-nm-thick ITO film was formed over the upper electrode. Through the above steps, the organic EL element 107 was formed.

A base film and the separation layer 553 were formed over the glass substrate serving as the formation substrate 551. The base film and the separation layer 553 were formed in a manner similar to that of the base film and the separation layer 503 formed over the formation substrate 501. Then, the layer 555 to be separated was formed over the separation layer 553 (FIG. 6B). In this example, the layer 555 to be separated includes an insulating film, a color filter, and the like.

For the layer 555 to be separated, first, an insulating film was formed over the separation layer 553. The insulating film was formed in a manner similar to that of the insulating film included in the layer 505. A color filter was formed over the insulating film, and then a 20-nm-thick ITO film was formed over the color filter. Here, the ITO film has higher wettability with respect to a material used for the adhesive layer 109 than the color filter; accordingly, generation of air bubbles can be prevented when the formation substrate 501 and the formation substrate 551 are bonded, whereby sealing of an element can be favorably performed.

Next, the formation substrate 501 and the formation substrate 551 were bonded with the adhesive layer 109 (FIG. 6C). A UV curable resin was used for the adhesive layer 109.

Then, the layer 505 was separated from the formation substrate 501 along the separation layer 503. Next, the layer 505 exposed by the separation from the formation substrate 501 was bonded to the first flexible substrate 101 with the use of the adhesive layer 123 (FIG. 6D). Similarly, the layer 555 was separated from the formation substrate 551 along the separation layer 553. Next, with the adhesive layer 187, the second flexible substrate 111 was bonded to the layer 555 exposed by the separation from the formation substrate 551 (FIG. 6E). A 20-μm-thick plastic film was used for each of the first flexible substrate 101 and the second flexible substrate 111. The first flexible substrate 101 and the second flexible substrate 111 are each a substrate with a coefficient of thermal expansion of 10 ppm/K or lower and less likely to be deformed by heat. A UV curable resin was used for the adhesive layer 123 and the adhesive layer 187.

Finally, the FPC 4505 was attached to each electrode of an input-output terminal portion with the use of an anisotropic conductive member.

Through the above steps, Sample a of this example was manufactured.

On the other hand, in Comparative sample b, the transistor 103, the planarization layer 105, and the organic EL element 107 were formed directly (without the separation layer) on the glass substrate serving as a supporting substrate. Then, a counter substrate and the supporting substrate were bonded with the use of an adhesive layer in a reduced-pressure atmosphere, so that the transistor 103, the planarization layer 105, the organic EL element 107, the color filter, and the like were sealed. A UV curable resin was used for the adhesive layer. A glass substrate provided with a color filter was used as the counter substrate. Finally, an FPC was attached to each electrode of an input-output terminal portion with the use of an anisotropic conductive member. Through the above steps, Comparative sample b of this example was manufactured.

Figure 20:
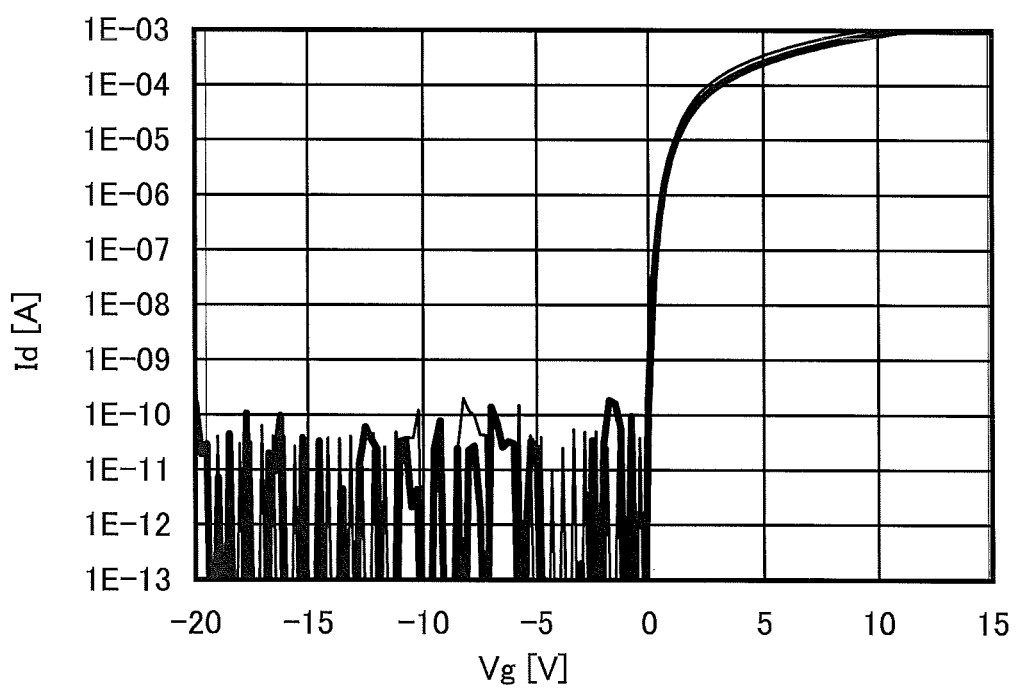
FIG. 20 shows the results of Example.

FIG. 20 shows the Vg-Id characteristics of the transistor in Sample a and the transistor in Comparative sample b. A bold solid line represents the result of Sample a and a fine solid line represents the results of Sample b. Here, measurements were performed by connecting an FPC terminal of each sample to a measuring system. The channel length and the channel width of each of the measured transistors were L/W=3 nm and 1000 nm. The thickness of the gate insulating film of each of the measured transistors was 100 nm when converted into a silicon oxide film (with a dielectric constant of 4.1).

The results in FIG. 20 show that there is no large difference between the characteristics of the transistor in Sample a and the characteristics of the transistor in Comparative sample b. Therefore, by application of one embodiment of the present invention, a flexible light-emitting device, which has reliability as high as a conventional non-flexible light-emitting device, can be manufactured.

This application is based on Japanese Patent Application serial no. 2012-107283 filed with Japan Patent Office on May 9, 2012, Japanese Patent Application serial no. 2012-107284 filed with Japan Patent Office on May 9, 2012, Japanese Patent Application serial no. 2012-108190 filed with Japan Patent Office on May 10, 2012, and Japanese Patent Application serial no. 2013-044857 filed with Japan Patent Office on Mar. 7, 2013, the entire contents of which are hereby incorporated by reference.

What is claimed is:

1. A light-emitting device comprising:
a first substrate;
a second substrate facing the first substrate;
a light-emitting element between the first substrate and the second substrate;
a third substrate partly overlapping with the first substrate;
a terminal portion electrically connected to the light-emitting element and over the third substrate, the terminal portion comprising at least two terminals; and
an adhesive layer between the first substrate and the second substrate,
wherein a coefficient of thermal expansion of the third substrate is 10 ppm/K or lower.

2. The light-emitting device according to claim 1,
wherein the adhesive layer is in contact with the third substrate.

3. The light-emitting device according to claim 1,
wherein the third substrate does not overlap with the light-emitting element.

4. The light-emitting device according to claim 1,
wherein an absolute value of a difference between a first coefficient of thermal expansion of the first substrate and a second coefficient of thermal expansion of the second substrate is within 10% of the first coefficient of thermal expansion or within 10% of the second coefficient of thermal expansion.

5. An electronic device comprising the light-emitting device according to claim 4 in a display portion.

6. A light-emitting device comprising:
a first substrate;
a second substrate facing the first substrate, the second substrate overlapping with a region of the first substrate;
a light-emitting element between the first substrate and the second substrate;
a terminal portion electrically connected to the light-emitting element and over an outer region of the region of the first substrate, the terminal portion comprising at least two terminals; and
an adhesive layer between the first substrate and the second substrate,
wherein a coefficient of thermal expansion of the first substrate is 10 ppm/K or lower.

7. The light-emitting device according to claim 6,
wherein an absolute value of a difference between a first coefficient of thermal expansion of the first substrate and a second coefficient of thermal expansion of the second substrate is within 10% of the first coefficient of thermal expansion or within 10% of the second coefficient of thermal expansion.

8. The light-emitting device according to claim 6,
wherein an FPC is electrically connected to the terminal portion though an anisotropic conductive layer.

9. An electronic device comprising the light-emitting device according to claim 6 in a display portion.

* * * * *